United States Patent
Snyder

(10) Patent No.: US 11,669,378 B2
(45) Date of Patent: Jun. 6, 2023

(54) METHOD AND APPARATUS FOR IMPROVING RELIABILITY OF DIGITAL COMMUNICATIONS

(71) Applicant: Ross Daniel Snyder, Austin, TX (US)

(72) Inventor: Ross Daniel Snyder, Austin, TX (US)

( * ) Notice: Subject to any disclaimer, the term of this patent is extended or adjusted under 35 U.S.C. 154(b) by 366 days.

(21) Appl. No.: 16/237,665

(22) Filed: Dec. 31, 2018

(65) Prior Publication Data

US 2019/0243696 A1   Aug. 8, 2019

Related U.S. Application Data

(63) Continuation of application No. 13/597,248, filed on Aug. 28, 2012, now Pat. No. 10,169,119.

(Continued)

(51) Int. Cl.
| | |
|---|---|
| *G06F 11/00* | (2006.01) |
| *H03M 13/35* | (2006.01) |
| *H04L 1/00* | (2006.01) |
| *H03M 13/15* | (2006.01) |
| *H03M 13/19* | (2006.01) |

(52) U.S. Cl.
CPC ......... *G06F 11/004* (2013.01); *H03M 13/356* (2013.01); *H04L 1/004* (2013.01); *H04L 1/007* (2013.01); *H04L 1/0047* (2013.01); *H04L 1/0072* (2013.01); *H03M 13/152* (2013.01);
(Continued)

(58) Field of Classification Search
CPC .... G06F 11/004; H04M 13/356; H04L 1/004; H04L 1/0047; H04L 1/007; H04L 1/0072; H03M 13/356; H03M 13/1505; H03M 13/1515; H03M 13/152; H03M 13/19
See application file for complete search history.

(56) References Cited

U.S. PATENT DOCUMENTS

| | | | | |
|---|---|---|---|---|
| 6,459,690 B1 * | 10/2002 | Le Strat | ................ | H04W 36/30 370/332 |
| 6,529,518 B1 * | 3/2003 | Webber | ................ | H04L 12/433 370/258 |

(Continued)

OTHER PUBLICATIONS

Daniels Electronics Ltd.; P25 Radio Systems Training Guide; Dec. 2009; Rev. 3-0-0; Daniels Electronics Ltd.; Victoria, BC, Canada V8V 1P8.

(Continued)

*Primary Examiner* — Walter J Divito
*Assistant Examiner* — Anthony Luo

(57) ABSTRACT

A method and apparatus for improving the reliability of a digital communications system is provided. In accordance with at least one embodiment, power of a transmitted signal is controlled to improve reliability. In accordance with at least one embodiment, timing of a transmitted signal is controlled to improve reliability. In accordance with at least one embodiment, interference is detected. In accordance with at least one embodiment, interference is localized. In accordance with at least one embodiment, combinatorial processing is used to increase reliability. In accordance with at least one embodiment, gradual rekeying is performed. In accordance with at least one embodiment, confirmed stepwise progression rekeying is performed. In accordance with at least one embodiment, transmission detection is provided. In accordance with at least one embodiment, reporting of cryptographic mode utilization is provided.

2 Claims, 19 Drawing Sheets

Related U.S. Application Data

(60) Provisional application No. 61/528,284, filed on Aug. 28, 2011.

(52) U.S. Cl.
CPC .... *H03M 13/1505* (2013.01); *H03M 13/1515* (2013.01); *H03M 13/19* (2013.01)

(56) References Cited

U.S. PATENT DOCUMENTS

| | | | |
|---|---|---|---|
| 7,423,785 B1 * | 9/2008 | Johnson | H04L 51/30 358/1.15 |
| 8,559,940 B1 | 10/2013 | Enzmann et al. | |
| 10,169,119 B1 | 1/2019 | Snyder | |
| 2002/0089948 A1 * | 7/2002 | Pucheu-Marque | H04W 88/18 370/329 |
| 2005/0046600 A1 | 3/2005 | Bretl et al. | |
| 2008/0192858 A1 | 8/2008 | Kim et al. | |
| 2008/0200148 A1 | 8/2008 | Fink | |
| 2008/0279093 A1 * | 11/2008 | Hassan | H04L 1/0002 370/216 |
| 2009/0016342 A1 | 1/2009 | Miyazaki et al. | |
| 2009/0028157 A1 | 1/2009 | Leyrer et al. | |
| 2009/0067551 A1 | 3/2009 | Chen et al. | |
| 2009/0175257 A1 | 7/2009 | Belmonte et al. | |
| 2009/0177760 A1 | 7/2009 | Gonzalez et al. | |
| 2010/0099360 A1 | 4/2010 | Sugai et al. | |
| 2010/0165900 A1 | 7/2010 | Hundal et al. | |
| 2010/0262506 A1 | 10/2010 | Zargahi et al. | |
| 2010/0296811 A1 | 11/2010 | Ohira et al. | |
| 2011/0150219 A1 | 6/2011 | Newberg et al. | |

OTHER PUBLICATIONS

S. Clark, P. Metzger, Z. Wasserman, K. Xu, M. Blaze; Security Weaknesses in the APCO Project 25 Two-Way Radio System; Nov. 18, 2010; University of Pennsylvania Department of Computer & Information Science; Philadelphia, PA 19104.

S. Clark, T. Goodspeed, P. Metzger, Z. Wasserman, K. Xu, M. Blaze; Why (Special Agent) Johnny (Still) Can't Encrypt: A Security Analysis of the APCO Project 25 Two-Way Radio System; In Proceedings of the 20th Usenix Security Symposium, Aug. 10-12, 2011; USENIX Association; Berkeley, CA 94710.

S. Glass, V. Muthukkumarasamy, M. Portmann, M. Robert; Insecurity in Public-Safety Communications: APCO Project 25; Oct. 2011; NICTA, Queensland Research Laboratory; Brisbane, Queensland, Australia, 4000.

* cited by examiner

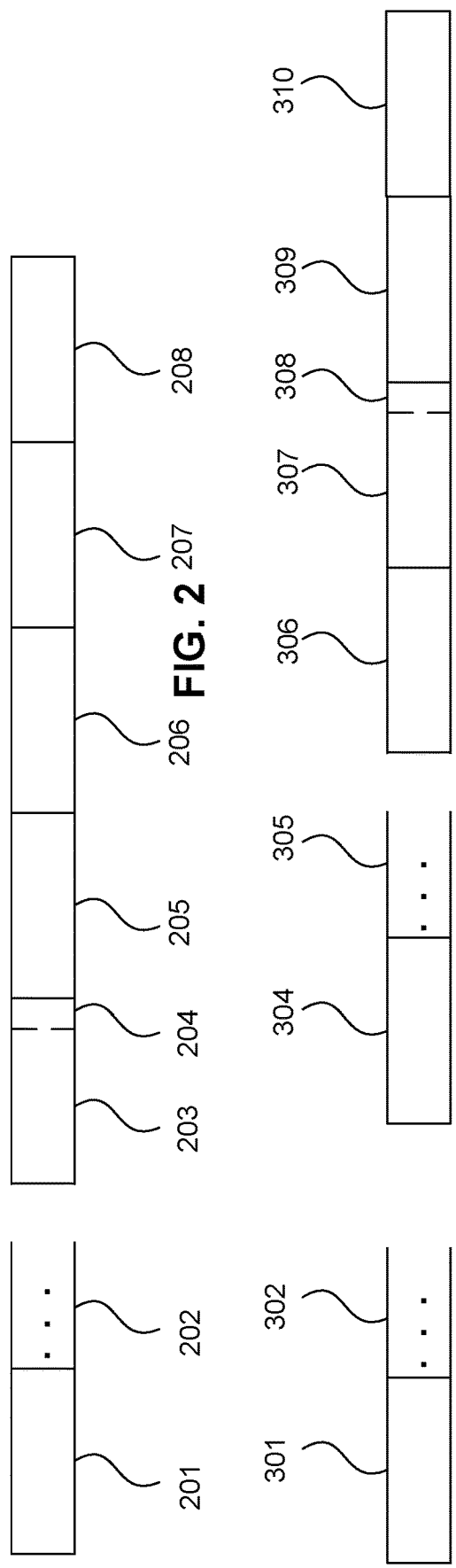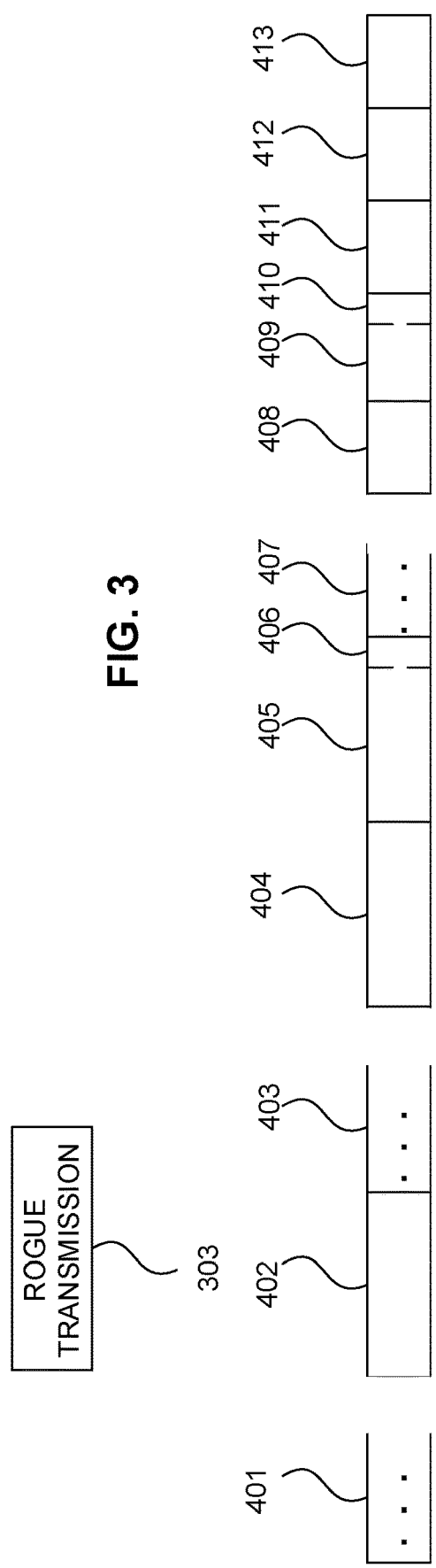

METHOD AND APPARATUS FOR IMPROVING RELIABILITY OF DIGITAL COMMUNICATIONS

CROSS-REFERENCE TO RELATED APPLICATIONS

This application is a continuation of U.S. patent application Ser. No. 13/597,248, filed Aug. 28, 2012, issuing as U.S. Pat. No. 10,169,119 on Jan. 1, 2019, the entirety of which is incorporated herein by reference, which claims the benefit of U.S. Provisional Application No. 61/528,284, filed Aug. 28, 2011, the entirety of which is incorporated herein by reference.

BACKGROUND OF THE INVENTION

(1) Field of the Invention

This invention relates generally to digital communications and more particularly to improving reliability of digital communications.

(2) Description of the Related Art

Communications have become essential to modern life. New forms of digital communications have become commonplace. Digital communications have been implemented over a variety of media, for example, electrical cabling, optical cabling, and electromagnetic radiation spectrally spanning at least a portion of a range from near-direct-current (near-DC) to optical wavelengths. Older forms of analog communications have been supplanted by digital communications, supplemented by digital communications, and/or adapted to be compatible and interoperable with digital communications. Thus, modern society is heavily dependent on digital communications.

Digital communications provide numerous advantages over analog communications, for example, noise reduction/ elimination, error detection, error correction, compressibility, ease of storage, ease of processing, etc. However, digital communications can also introduce vulnerabilities that did not exist with analog communications. Digital communications are typically processed algorithmically in ways analog communications are not. Thus, possibilities exist for altering digital data being processed so as to interfere with such algorithmic processing. For example, if a digital data unit begins with an initial data sequence used, for example, to recognize and/or extract timing information from the digital data unit, alteration of the initial data sequence can prevent reception of the digital data unit. Such a phenomenon can be particularly pernicious when alteration of only a relatively small initial data sequence can prevent reception of a relatively much larger amount of user data being transmitted even if the user data itself is not altered in any way.

At the 20$^{th}$ Usenix Security Symposium on Aug. 10-12, 2011, a paper entitled "Why (Special Agent) Johnny (Still) Can't Encrypt: A Security Analysis of the APCO Project 25 Two-Way Radio System" was presented. The authors identify several alleged vulnerabilities of Association of Public Safety Communications Officials (APCO) Project 25 (P25) radio systems. Such alleged vulnerabilities span attacks exploiting alleged user interface ambiguities, traffic analysis and active location tracking, denial of service through reflexive partial jamming, and selective jamming. The authors give an example of selective jamming being used to stimulate failure of a radio's encrypted mode, thereby urging the radio user to revert to the radio's unencrypted mode. While the authors propose several end-user stopgap mitigations, such as disabling the "secure" switch on a radio and instead defining separate channels in the radio for encrypted and unencrypted versions of the same radio frequency and also reducing the frequency of rekeying to "improve the likelihood that users who wish to communicate securely will share common key material when they need it," the presenter of the paper at the 20$^{th}$ Usenix Security Symposium concluded "So, you know, in the long term, the P25 protocols are kind of hopelessly broken . . . ." Thus, a solution is needed to improve the reliability of the allegedly "kind of hopelessly broken" "P25 protocols" and of other digital communication techniques generally.

BRIEF DESCRIPTION OF THE SEVERAL VIEWS OF THE DRAWINGS

The present invention may be better understood, and its features made apparent to those skilled in the art by referencing the accompanying drawings.

FIG. 2 is a diagram of a transmission sequence in accordance with at least one embodiment.

FIG. 3 is a diagram of a transmission sequence in accordance with at least one embodiment.

FIG. 4 is a diagram of a transmission sequence in accordance with at least one embodiment.

The use of the same reference symbols in different drawings indicates similar or identical items.

DETAILED DESCRIPTION OF THE INVENTION

Figure 1:
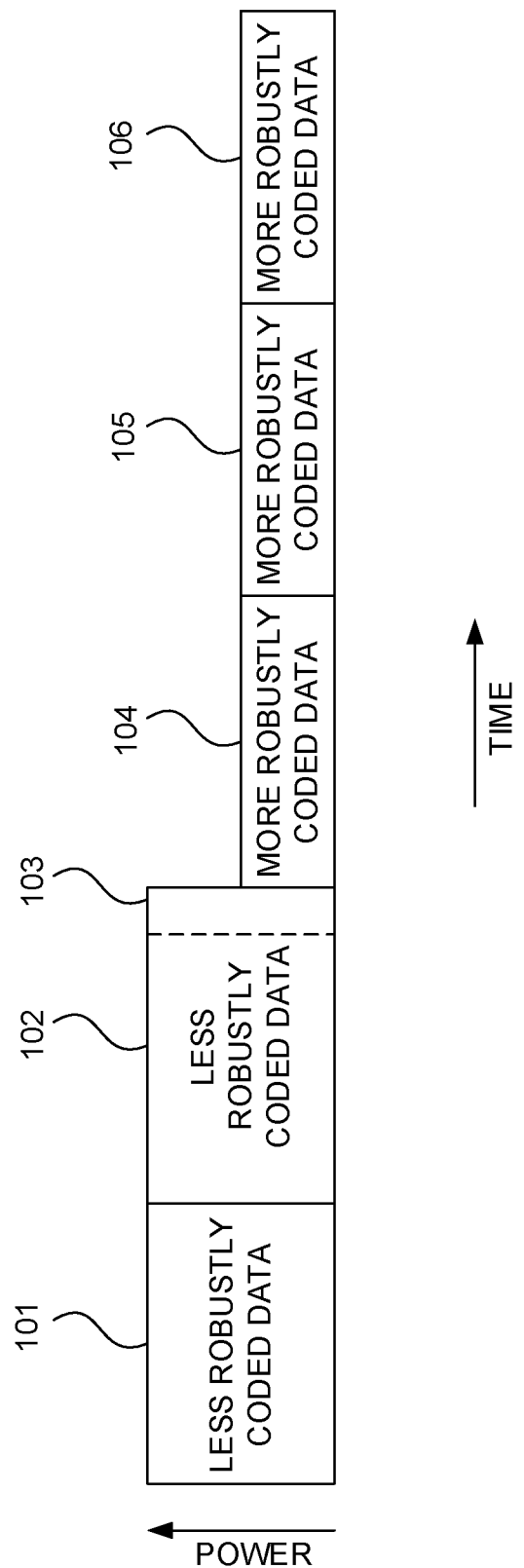
FIG. 1 is a diagram of a transmission in accordance with at least one embodiment.

A method and apparatus for improving the reliability of a digital communications system is provided. In accordance with at least one embodiment, power of a transmitted signal is controlled to improve reliability. As an example, a transmitter power output of a transmitter is transiently increased during transmission of less robustly coded data and decreased during transmission of more robustly coded data. In accordance with at least one embodiment, timing of a transmitted signal is controlled to improve reliability. As an example, a truncated frame synchronization sequence followed by a normal frame synchronization sequence and its corresponding frame are transmitted to increase immunity to an interfering signal, such as a "smart jammer" signal. In accordance with at least one embodiment, interference is detected. As an example, a truncated frame synchronization sequence is transmitted followed by a reception operation to check for the presence of a transmission from another transmitter, such as a "smart jammer." In accordance with at least one embodiment, interference is localized. In accordance with at least one embodiment, combinatorial error correction is provided. In accordance with at least one embodiment, combinatorial processing is used to increase reliability. As an example, less robustly coded data is combinatorially processed. In accordance with at least one embodiment, a deterministic Turing machine is used to provide error correction for less robustly coded data. In accordance with at least one embodiment, multiple instances of processors, which may be multiple individual processors, or a hyperthreaded processor, or a multiple core processor, or virtualized processors, are allocated to process the multiple possible data units comprising different possible combinations of uncertain bits. In accordance with at least one embodiment, probabilistic analysis of possible values is biased using historical data values. In accordance with at least one embodiment, known historical values are used as a basis for comparison to any uncertain bits. In accordance with at least one embodiment, a probabilistic Turing machine is used to provide error correction for less robustly coded data. In accordance with at least one embodiment, nondeterministic Turing machine is used to provide error correction for less robustly coded data. In accordance with at least one embodiment, a quantum Turing machine is used to provide error correction for less robustly coded data. In accordance with at least one embodiment, gradual rekeying is performed. In accordance with at least one embodiment, confirmed stepwise progression rekeying is performed. In accordance with at least one embodiment, transmission detection is provided. In accordance with at least one embodiment, a technique for providing annunciation of the occurrence of a radio transmission is provided. In accordance with at least one embodiment, qualification of ammeter output information is performed. In accordance with at least one embodiment, reporting of cryptographic mode utilization is provided.

FIG. 1 is a diagram of a transmission in accordance with at least one embodiment. In accordance with at least one embodiment, different coding schemes are used for different types of data. For example, in accordance with one embodiment, a P25 network identifier (NID) is coded using a (63, 16, 23) primitive Bose/Ray-Chaudhuri/Hocquenghem (BCH) code plus one parity bit, while the header code word of a P25 header data unit is coded using an (18, 6, 8) shortened Golay code, and logical link data units of a P25 voice frame are coded using a (24, 12, 13) Reed-Solomon code and a (10, 6, 3) Hamming code. Such different coding schemes provide different levels of error correction capability, resistance to fading, resistance to interference, etc. Those differences can affect the ability to accurately receive a data transmission. In accordance with at least one embodiment, different functionalities of data in a data transmission can also affect the ability to accurately receive a data transmission. For example, in accordance with at least one embodiment, a P25 NID includes a data unit identifier (data unit ID) that identifies the type of data unit being transmitted. For example, a data unit ID 0000 represents a header data unit (HDU), a data unit ID 0011 represents a terminator data unit (TDU) without subsequent link control, a data unit ID 0101 represents a logical link data unit 1 (LDU1), a data unit ID 1010 represents a logical link data unit 2 (LDU2), a data unit ID 1100 represents a packet data unit (PDU), and a data unit ID 1111 represents a terminator data unit (TDU) with subsequent link control. As a data unit is processed in accordance with its type, failure to accurately receive the data unit ID can prevent the data transmission, as a whole, from being accurately received. Accordingly, some portions of a data transmission can be more critical to reception of a data transmission, while other portions of a data transmission can be less critical to reception of the data transmission.

Higher transmitter power output can increase the likelihood of receiving a data transmission, while lower transmitter power output can decrease the likelihood of receiving a data transmission. In accordance with at least one embodiment, a transmitter power output of a transmitter is increased during transmission of less robustly coded data and decreased during transmission of more robustly coded data. In accordance with at least one embodiment, a transmitter power output of a transmitter is increased during transmission of more critical data and decreased during transmission of less critical data. Modern transmitters typically allow precise power control of the transmitter power output of a transmitter. In accordance with one embodiment, a microcontroller provides a digital to analog converter (DAC) output to control the gain of a power amplifier to control transmitter power output. Often, transmitters used for frequency modulation (FM) and/or compatible four-level frequency modulation (C4FM) comprise Class C amplifiers that exhibit nonlinearity that makes them unsuitable for amplitude modulation (AM) or more complex modulation schemes (e.g., compatible quadrature phase shift keying (CQPSK)) that involve amplitude modulation (or are mathematically equivalent to other complex modulation schemes that involve amplitude modulation). Accordingly, the precise power control of the transmitter power output of a transmitter is heretofore typically not adjusted on an intratransmission basis. By using the precise power control to perform intratransmission adjustment of transmitter power output as a function of the type of data being transmitted, at least one embodiment is implemented to provide more reliable communications.

Since changes in the amplitude of a radio frequency (RF) carrier, as viewed in the time domain, appear as sidelobes of the RF carrier when viewed in the frequency domain, in accordance with at least one embodiment, an intratransmission change in transmitter power output is performed so as to minimize the interference of such sidelobes to reception of the transmission. In accordance with at least one embodiment, an increase or decrease in transmitter power output is changed as rapidly as possible (e.g., as a step function), to minimize the temporal duration of the sidelobes and to dilute the power of the sidelobes across a larger amount of spectrum in the frequency domain. In accordance with at least one embodiment, an increase or decrease in transmitter power output is changed at a controlled rate such that the sidelobes are positioned unambiguously far in the frequency domain from the positions of frequency modulated symbols. For example, if symbols representing data are frequency modulated with deviations of −1800 Hz, −600 Hz, +600 Hz, and +1800 Hz (e.g., in a exemplary case of C4FM), the rate of transmit power output increase or decrease may be controlled so as to yield sidelobes at, for example, −1200 and +1200 Hz, minimizing the possibility of the sidelobes being misinterpreted as valid symbols. As another example, with symbols having −1800 Hz, −600 Hz, +600 Hz, and +1800 Hz deviation, the rate of transmit power output increase or decrease may be controlled so as to yield sidelobes at, for example, −2400 Hz and +2400 Hz, minimizing the possibility of the sidelobes being misinterpreted as valid symbols.

Since frequency modulation modulates the frequency of an RF carrier based on the amplitude of the modulating signal, in accordance with at least one embodiment, the rate of change of the transmitter power output may be controlled to place the sidelobes beyond the deviation of an FM signal. For example, if the deviation of symbols of a data transmission is nominally 1800 Hz, the rate of transmit power output increase or decrease may be controlled so as to yield sidelobes at, for example, −2400 Hz and +2400 Hz to minimize the possibility of the sidelobes being misinterpreted as valid symbols.

In accordance with at least one embodiment, the rate of change of the transmitter power output may be controlled to place the sidelobes much closer to the RF carrier than the deviation of an FM signal. For example, if the deviation of symbols of a data transmission is nominally 1800 Hz, the rate of transmit power output increase or decrease may be controlled so as to yield sidelobes at, for example, −900 Hz and +900 Hz or −1200 Hz and +1200 Hz to minimize the possibility of the sidelobes being misinterpreted as valid symbols.

In accordance with at least one embodiment, the rate of change of the transmitter power output may be controlled to place the sidelobes much closer to the RF carrier than the deviation of an FM signal. For example, if the deviation of symbols of a data transmission is nominally −1800 Hz, −600 Hz, +600 Hz, and +1800 Hz, the rate of transmit power output increase or decrease may be controlled so as to yield sidelobes at, for example, −200 Hz and +200 Hz to minimize the possibility of the sidelobes being misinterpreted as valid symbols.

In accordance with at least one embodiment, to mitigate the stepwise increase or decrease of transmitter output power that could result from a microcontroller changing the transmit power output values being provided to a DAC to generate an analog output to control the gain of the power amplifier, a circuit for controlling the rise time and fall time of the analog output from the DAC may be added between the DAC and the power amplifier to control the rate of increase or decrease of transmitter output power. For example, a resistor capacitor (RC) network having a resistor in series with line for the analog output from the DAC to the power amplifier and a capacitor from the line for the analog output at the input of the power amplifier to ground can be used to form a low pass filter to enforce a minimum rise time and fall time of the analog output from the DAC. Thus, even an instantaneous stepwise transition of the DAC output can be controlled to provide the desired rate of increase or decrease of transmitter power output.

In accordance with at least one embodiment, a stepwise increase or decrease of transmitter output power is provided, and the resulting effect on the transmitted signal is sampled. Any distortion introduced into the transmitted signal can be quantified, for example, by sampling the transmitted signal using an analog to digital converter (ADC) and performing a Fourier transform using digital signal processing (DSP). Based on the result of the Fourier transform, the stepwise increase or decrease of transmitter output power can be adjusted, with the resulting effect on transmitted signal again sampled, distortion quantified, and further adjustment performed until the distortion is minimized or modified so as to have a minimal effect on the reception of the transmitted signal. Such an adaptive process of adjusting the curves according to which transmitter output power is increased or decreased in an intratransmission manner may be performed repetitive during operation of a transmitter, may be performed initially when a device with a transmitter is turned on, or may be performed as part of an alignment process, with the result saved and used to control transmitter operation over multiple power cycles of the device comprising the transmitter.

In accordance with at least one embodiment, a pseudonoise (PN) sequence can be used to increase or decrease the DAC values so the position of the sidelobes resulting from the increase or decrease of transmitter output power can be spread pseudorandomly in the frequency domain, minimizing the power at an particular possible sidelobe position. For example, the analog output of the DAC may start at a preexisting analog level corresponding to a preexisting transmitter power output level and non-monotonically change to several various levels at several times until it arrives at a desired analog level corresponding to a desired transmitter power output level.

In accordance with an embodiment illustrated in FIG. 1, a data transmission comprises less robustly coded data portion 101, less robustly coded data portion 102, more robustly coded data portion 104, more robustly coded data portion 105, and more robustly coded data portion 106, with less robustly coded data portion 102 comprising data subportion 103. In accordance with at least one embodiment, less robustly coded data portion 101 and less robustly coded data portion 102 are transmitted at a higher transmitter power output, and more robustly coded data portion 104, more robustly coded data portion 105, and more robustly coded data portion 106 are transmitted at a lower transmitter power output. As an example, in accordance with at least one embodiment, less robustly coded data portion 101 may be a frame synchronization (FS) data portion, less robustly coded data portion 102 may be a network identifier (NID) data portion, with data subportion 103 being a data unit ID, more robustly coded data portion 104 may be a logical link data unit 1 (LDU1) data portion, more robustly coded data portion 105 may be a logical link data unit 2 (LDU2) data portion, and more robustly coded portion 106 may be a terminator data unit (TDU) data portion.

In accordance with at least one embodiment, a transmitter power output of a transmitter is transiently increased during transmission of less robustly coded data and decreased during transmission of more robustly coded data. While less robustly coded data may comprise, for example, only a few percent of the amount of data in a data unit being transmitted, failure to receive it properly could impair the reception of the entire data unit. By increasing the transmitter output power of a transmitter when transmitting the less robustly coded, but using a lower transmitter output power for more robustly coded data, improved signal strength and reduced bit error rates can be realized while saving energy and conserving battery charge relative to using increased power all of the time. Moreover, reducing the transmitter power output for the transmission of more robustly coded data can help reduce RF power amplifier power dissipation, increase battery life, and reduce the biological specific absorption rate (SAR) of a wireless transmitter while maintaining the overall increase in reliability of transmission obtained by increasing the transmitter power output for the less robustly coded data.

FIG. 2 is a diagram of a transmission sequence in accordance with at least one embodiment. One approach to jamming digital signals, for example, P25 signals, is to locate a vulnerable portion of a data transmission that, if jammed, will result in a disproportionately large detrimental affect on the reception of the data transmission. By listening for a data transmission and receiving enough of the data transmission to locate the occurrence of such a vulnerable portion, a "smart jammer" may transmit an interfering signal only briefly enough to jam the vulnerable portion of the data transmission, while not transmitting an interfering signal for the entire duration of the data transmission, thereby conserving its power source and minimizing its risk of detection. If such a "smart jammer" were configured to recognize a vulnerable portion that is common to all data transmissions, it could effectively impair all communications of a vulnerable protocol on a particular channel. More insidiously, if such a "smart jammer" were configured to recognize certain types of data transmissions, for example, encrypted data transmissions, it could jam those transmissions, forcing users to elect to use other types of data transmissions (e.g., unencrypted data transmissions), thereby altering users' behaviors so as to reduce the information security of the data transmissions or so as to achieve other desired results. As another example, if a "smart jammer" were configured to recognize communications from a particular user (e.g., a particular radio identifier (radio ID)), the "smart jammer" could jam only the transmissions from such radio ID, isolating the user with that radio ID from the network while otherwise allowing the network to continue to operate properly from the perspective of all of the other users.

In accordance with at least one embodiment, a first portion of a data transmission comprising, for example, frame synchronization (FS) data portion 201 and at least a portion of network identifier (NID) data portion 202, is transmitted but then the data transmission is truncated, with the radio immediately switching from transmission mode to reception mode and listening for any interfering signals that may be present on the same frequency. If no interfering signal is detected, the radio begins again transmission of the first portion of the data transmission, illustrated as data portion 203 comprising data portion 204, but also continues with transmission of the remainder of the data transmission, illustrated as data portions 205, 206, 207, and 208.

In accordance with at least one embodiment, a first instance of a frame synchronization sequence is transmitted, a first instance of a network identifier sequence is at least partially transmitted but then the transmission of the first instance of the network identifier sequence is terminated, a second instance of the frame synchronization sequence is transmitted, a second instance of the network identifier sequence is fully transmitted, and the remainder of the data unit to which the frame synchronization sequence and network identifier pertain is transmitted. In accordance with at least one embodiment, a reception operation is performed after the termination of the transmission of the first instance of the network identifier, wherein an amplitude of a received signal is compared to a threshold to determine any presence of a transmission from another transmitter. In accordance with at least one embodiment, the threshold is a static threshold. In accordance with at least one embodiment, the threshold is a dynamic threshold. In accordance with at least one embodiment, the dynamic threshold is based on a previous measurement of the amplitude of the received signal. In accordance with at least one embodiment, the amplitude of the received signal is measured over time, with changes in such amplitude over such time establishing any presence of a transmission from another transmitter. In accordance with at least one embodiment, the point at which the transmission of the first instance of the network identifier is terminated is varied over multiple truncation operations. In accordance with at least one embodiment, any presence of a transmission from another transmitter is correlated to the point at which the transmission of the first instance of the network identifier is terminated. In accordance with at least one embodiment, strong correlation of the presence of a transmission from another transmitter to at least a first point of termination of transmission of the first instance of the network identifier is used to detect the presence of a "smart jammer," wherein the "smart jammer" initiates its jamming in response to detection of particular attributes of a received signal received by the "smart jammer."

FIG. 3 is a diagram of a transmission sequence in accordance with at least one embodiment. Transmission begins with a frame synchronization (FS) data portion 301 and continues with at least a portion of network identifier (NID) data portion 302, the transmission of which is truncated as the radio immediately switches from transmission mode to reception mode. If an interfering signal (e.g., rogue transmission 303) is detected during reception after truncation of transmission, the radio waits until the interfering signal is no longer present, then restarts transmission of a frame synchronization (FS) data portion 304 and at least a portion of a network identifier (NID) 305, truncating the transmission of the at least the portion of the network identifier (NID) 305 to listen for any interfering signals. If no interfering signal is detected, the radio again restarts transmission of a frame synchronization (FS) data portion 306, continuing to transmit a network identifier (NID) 307 (comprising data unit identifier (data unit ID) 308), a payload data unit (e.g., a packet data unit (PDU) or a voice frame comprising a first logical link data unit (LDU1) and a second logical link data unit (LDU2)), and a terminator data unit (TDU). Thus, not only can interfering signals be detected and avoided, but also transmission of data can be performed in a manner increasing its likelihood of successful reception.

FIG. 4 is a diagram of a transmission sequence in accordance with at least one embodiment. Since a "smart jammer" could be configured to be triggered based on various portions of a data transmission with a legitimate user not having a priori knowledge of the precise portion of the data transmission that will be attacked, an iterative progressive approach to baiting a "smart jammer" may be implemented in accordance with at least one embodiment. First, at least a portion of a frame synchronization (FS) data portion 401 is transmitted, but its transmission is truncated, and the radio immediately switches from transmission mode to reception mode to listen for any interfering signal. If no interfering signal is heard, the transmission of a frame synchronization (FS) data portion 402 is restarted, followed by transmission of at least a portion of a network identifier (NID) data portion 403, but the transmission of NID 403 is truncated, and the radio immediately switches from transmission mode to reception mode and listens for any interfering signal. If no interfering signal is heard, the transmission of a frame synchronization (FS) data portion 404 is restarted, followed by transmission of the network identifier (NID) 405 (comprising data unit identifier (data unit ID) 406) and at least a portion of a payload data portion 407 (e.g., a packet data unit (PDU) or a voice frame comprising a first logical link data unit (LDU1) and a second logical link data unit (LDU2)), but the transmission of the at least the portion of the payload data portion 407 is truncated, and the radio immediately switches from transmission mode to reception mode, listening for any interfering signal that may be present. If no interfering signal is heard, transmission of a frame synchronization (FS) data portion 408 is restarted, followed by transmission of a network identifier (NID) 409 (comprising data unit identifier (data unit ID) 410), and a payload data unit 411 (e.g., a packet data unit (PDU) or a first logical link data unit (LDU1)). If the payload is, for example, a voice frame, it may comprise a second payload data unit 412 (e.g., a second logical link data unit (LDU2)), which is then transmitted. The one or more payload data units are then followed by a terminator data unit (TDU), which may or may not include link control information and which is then transmitted.

Figure 5:
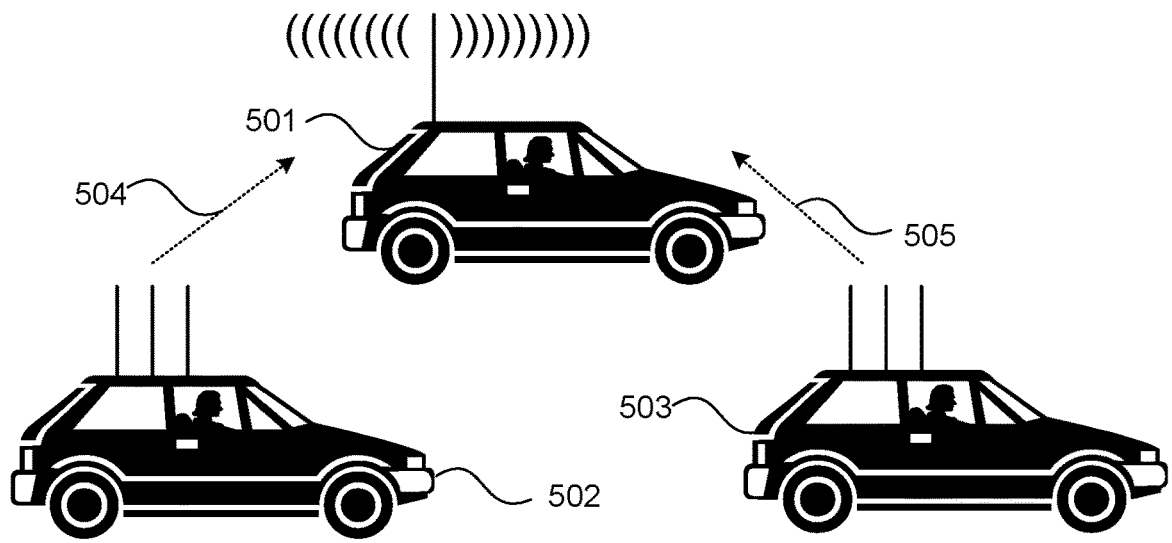
FIG. 5 is a diagram of a localization system in accordance with at least one embodiment.

FIG. 5 is a diagram of a localization system in accordance with at least one embodiment. In accordance with at least one embodiment, when an interfering signal is detected, localization of the source of the interfering signal may be performed. For example, if the source of the interfering signal is transmitter 501, a directional receiver 502 may determine a direction 504 toward transmitter 501, and a directional receiver 503 may determine a direction 505 toward transmitter 501. By triangulating directions 504 and 505, a location of transmitter 501 can be determined where directions 504 and 505 cross. Examples of directional receivers that may be used, in accordance with at least one embodiment, include Doppler direction finding systems, directional antennas, and phased array antennas. In accordance with at least one embodiment, in a voting system or simulcast system having a plurality of sites with transmitters and/or receivers cooperatively operating on at least one common frequency, such sites may be used for directional receivers, such as directional receivers 502 and 503. In accordance with at least one embodiment, localization of the transmission from the another transmitter is performed. In accordance with at least one embodiment, time difference of arrival (TDOA) localization is performed. In accordance with at least one embodiment, Doppler direction finding localization is performed. In accordance with at least one embodiment, phased array antenna steering localization is performed.

Figure 6:
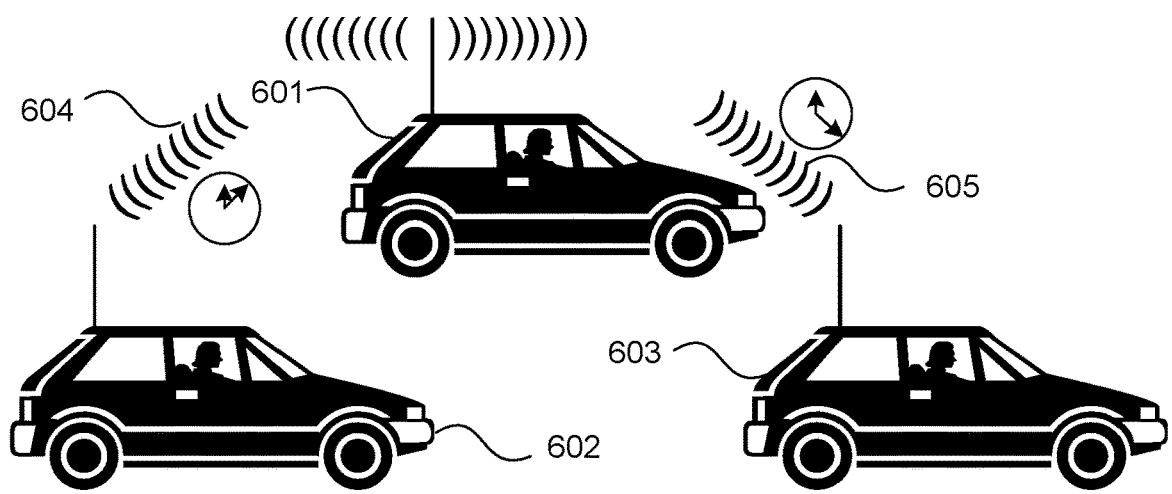
FIG. 6 is a diagram of a localization system in accordance with at least one embodiment.

FIG. 6 is a diagram of a localization system in accordance with at least one embodiment. In accordance with at least one embodiment, when an interfering signal is detected, localization of the source of the interfering signal may be performed. For example, a time difference of arrival (TDOA) technique may be used by multiple receivers to determine the location of a transmitter 601. If a signal arrives along a first path 604 at a first receiver 602 at a first time and arrives along a second path 605 at a second receiver 603 at a second time, the difference between the first time of arrival and the second time of arrival may be used to calculate a range of locations where transmitter 601 may be located. If additional receivers are used or if the location of receivers 602 and 603 and/or the location of transmitter 601 changes over time, even just receivers 602 and 603 may be enough to accurately locate transmitter 601. In accordance with at least one embodiment, in a voting system or simulcast system having a plurality of sites with transmitters and/or receivers cooperatively operating on at least one common frequency, such sites may be used for receivers, such as first receiver 602 and second receiver 603.

Figure 7:
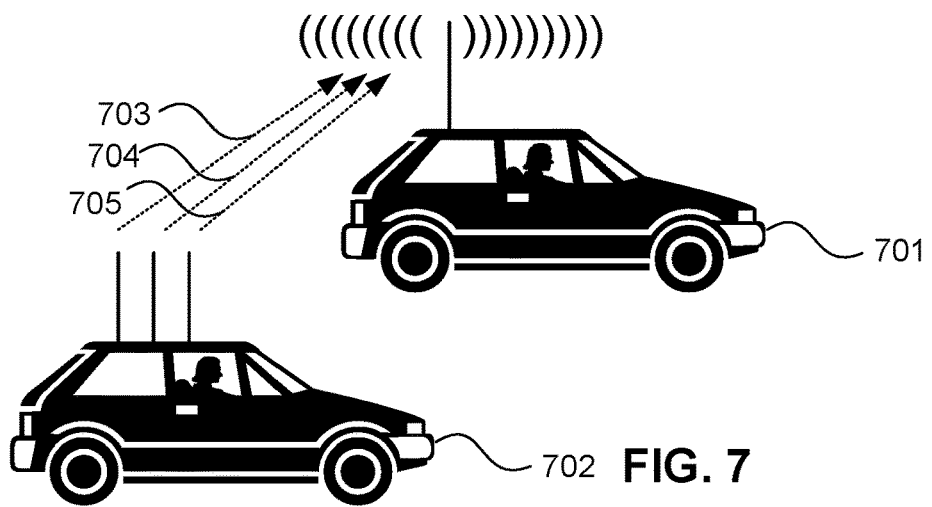
FIG. 7 is a diagram of a localization system in accordance with at least one embodiment.

FIG. 7 is a diagram of a localization system in accordance with at least one embodiment. In accordance with at least one embodiment, when an interfering signal is detected, localization of the source of the interfering signal may be performed. For example, a phased array receiver system 702 may be used to locate transmitter 701. Phased array receiver system 702 comprises multiple antennas whose phase relationships can be controlled to obtain directions 703, 704, and 705 toward transmitter 701.

Figure 8:
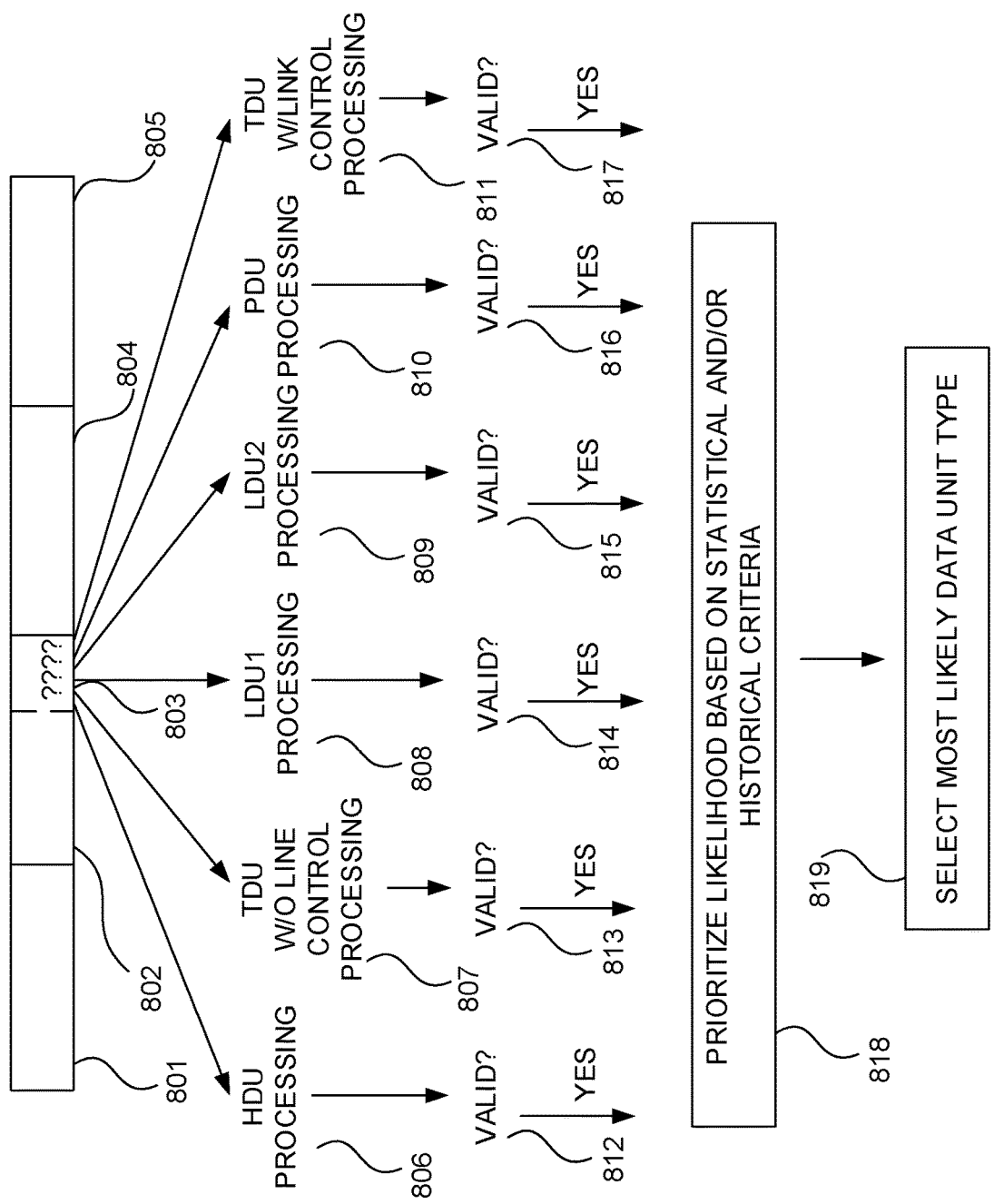
FIG. 8 is a diagram of a combinatorial processing of uncertain data in accordance with at least one embodiment.

FIG. 8 is a diagram of a combinatorial processing of uncertain data in accordance with at least one embodiment. In accordance with at least one embodiment, a data transmission comprises frame synchronization (FS) data portion 801, network identifier (NID) data portion 802 (which comprises data unit ID 803), payload data unit portion 804 (which may, for example, be a packet data unit (PDU) or a voice frame comprising a first logical link data unit (LDU1) and a second logical link data unit (LDU2), and a terminator data unit (TDU) 805 (which may or may not comprise link control information). If the bits of the data unit ID 803 are received with certainty, the data transmission may be processed according to the type of data unit identified by the data unit ID 803. However, if any uncertainty exists as the bits of the data unit ID 803, for example, if the parity bit or the BCH code associated with the network identifier (NID) indicates the possibility of an error, combinatorial processing of the uncertain data may be performed, where the uncertain data is processed according to the possible values that it might have. For example, if all bits of data unit ID 803 are uncertain, data unit ID 803 is processed as if it may be an HDU according to HDU processing 806, as if it may be a TDU without link control according to TDU without link control processing 807, as if it may be an LDU1 according to LDU1 processing 808, as if it may be an LDU2 according to LDU2 processing 809, as if it may be a PDU according to PDU processing 810, and as if it may be a TDU with link control according to TDU with link control processing 811. When HDU processing 806 is done, validation 812 is performed to determine if the data unit may be a valid HDU, with the result being provided to prioritization step 818. When TDU without link control processing 807 is done, validation 813 is performed to determine if the data unit may be a valid TDU without link control, with the result being provided to prioritization step 818. When LDU1 processing 808 is done, validation 814 is performed to determine if the data unit may be a valid LDU1, with the result being provided to prioritization step 818. When LDU2 processing 809 is done, validation 815 is performed to determine if the data unit may be a valid LDU2, with the result being provided to prioritization step 818. When PDU processing 810 is done, validation 816 is performed to determine if the data unit may be a valid PDU, with the result being provided to prioritization step 818. When TDU with link control processing 811 is done, validation 817 is performed to determine if the data unit may be a valid TDU with link control, with the result being provided to prioritization step 818. In prioritization step 818, likelihood of whether the data unit is an HDU, a TDU without link control, a LDU1, a LDU2, a PDU, or a TDU with link control is prioritized based on statistical and/or historical criteria. In selection step 819, a most likely data unit type is selected, and the results of processing according to the most likely data unit type are utilized by the radio as if the data unit ID had unambiguously identified the data unit type as being the most likely data unit type. For example, audio based on LDU1 processing 808 or LDU2 processing 809 may be provided to a user or data received according to PDU processing 810 may be displayed, stored, or otherwise processed and relied upon.

In accordance with at least one embodiment, combinatorial error correction is provided. In accordance with at least one embodiment, less robustly coded data of a transmission is identified. In accordance with at least one embodiment, more robustly coded data of a transmission is identified. In accordance with at least one embodiment, the less robustly coded data is not error correction coded. In accordance with at least one embodiment, the more robustly coded data is error correction coded. In accordance with at least one embodiment, any correctable errors in the error correction coded more robustly coded data are corrected. In accordance with at least one embodiment, any non-correctable errors in the error correction coded more robustly coded data are detected. In accordance with at least one embodiment, a finite range of possible values of the non-correctable errors is determined. In accordance with at least one embodiment, implications of each possible value of the finite range of possible values on other data values within the transmission are determined. Values of the other data values are determined and tentative values of the possible values of the finite range of possible values are determined. In accordance with at least one embodiment, probabilistic analysis of the likelihood of the tentative values being accurate is performed. In accordance with at least one embodiment, the tentative values are accepted as correct and the tentative values are substituted for the non-correctable error values to provide corrected data.

In accordance with at least one embodiment, less robustly coded data is combinatorially processed. Since inaccurate reception of the less robustly coded data could adversely affect reception of the entire data unit, an a posteriori technique for validating the less robustly coded data can increase the likelihood that the entire data unit is properly received. Even if the less robustly coded data does not afford sufficient information by itself to correct for possible errors in the less robustly coded data, differences in the content of the data unit for which the less robustly coded data may be intended to be an indicator may be used to deduce the content of the less robustly coded data so as to make it an indicator for the type of data unit that corresponds to the actual content of the data unit. For example, if a terminator data unit (TDU) without link control information contains 28 null bits beginning 30 bits from its end, there is a substantial likelihood that a data unit having 28 null bits beginning 30 bits from its end is a TDU without link control information regardless of the values of the four bits of the data unit identifier (data unit ID) that pertains to it. As another example, if a header data unit (HDU) is encoded with (18, 6, 8) shortened Golay code after (36, 20, 17) Reed-Solomon coding, and decoding an unknown data unit using the (18, 6, 8) shortened Golay code and (36, 20, 17) Reed-Solomon code yields plausible values of, for example, the manufacturer's code (MFID), algorithm ID (ALGID), and talkgroup ID (TGID), the data unit can be considered to have a high likelihood of being an HDU. If a voice frame is encoded with Golay and Hamming codes, then exclusive-ORed (XORed) with a 114-bit pseudo-noise (PN) sequence, then the information is interleaved throughout the voice frame, and decoding an unknown data unit using the reverse of those steps yields plausible values for a sequence of voice code information vectors, the data unit may be presumed to have a high likelihood being a voice frame (i.e., a combination of an LDU1 and an LDU2).

In accordance with at least one embodiment, a deterministic Turing machine is used to provide error correction for less robustly coded data. In accordance with at least one embodiment, a deterministic Turing machine performs combinatorial processing of the less robustly coded data, exhaustively processing alternative versions of a data unit comprising the less robustly coded data. In accordance with at least one embodiment, each alternative version of the data unit represents a different possible combination of any uncertain bits of the less robustly coded data.

In accordance with at least one embodiment, multiple instances of processors, which may be multiple individual processors, or a hyperthreaded processor, or a multiple core processor, or virtualized processors, are allocated to process the multiple possible data units comprising different possible combinations of uncertain bits. For example, if the four bits of a data unit ID of a network identifier (NID) of a P25 transmission are uncertain, where those four bits could represent, for example, six possible types of data units (where 0000=header data unit (HDU), 0011=terminator data unit (TDU) without subsequent link control, 0101=logical link data unit 1 (LDU1), 1010=logical link data unit 2 (LDU2), 1100=packet data unit (PDU), and 1111=terminator data unit (TDU) with subsequent link control), a first processor may be allocated to process the data unit as if it were a HDU, a second processor may be allocated to process the data unit as if it were a TDU without subsequent link control, a third processor may be allocated to process the data unit as if it were a LDU1, a fourth processor may be allocated to process the data unit as if it were a LDU2, a fifth processor may be allocated to process the data unit as if it were a PDU, and a sixth processor may be allocated to process the data unit as if it were a TDU with subsequent link control. During processing by the respective processors, at least one processor may determine that the likelihood of the data unit being the type of data unit it is attempting to process is negligibly small and report that result to the other processors or to a processor acting as an arbiter in the data unit type determination process. For example, if attempting to decode the (18, 6, 8) shortened Golay coding of a HDU yields a result so erroneous as to be practically unintelligible, the first processor may conclude the data unit is not likely to be an HDU. As another example, if the first 28 of the last 30 bits of the data unit are not null, the second processor may conclude the data unit is not likely to be a TDU without link control information. As another example, if attempting to decode the Hamming code (10, 6, 3) and the Reed-Solomon code (24, 12, 13) of a LDU1 yields a result so erroneous as to be practically unintelligible, the third processor may conclude the data unit is not likely to be a LDU1. As yet another example, if attempting to decode the Hamming code (10, 6, 3) and the Reed-Solomon code (24, 16, 9) of a LDU2 yields a result so erroneous as to be practically unintelligible, the fourth processor may conclude the data unit is not likely to be a LDU2. As yet another example, if attempting to decode the Trellis coded blocks of a PDU yields a result so erroneous as to be practically unintelligible, the fifth processor may conclude the data unit is not likely to be a PDU. As a further example, if attempting to decode the extended Golay code (24, 12, 8) and the Reed-Solomon code (24, 12, 13) of the TDU with link control information yields a result so erroneous as to be practically unintelligible, the sixth processor may conclude the data unit is not likely to be a TDU with link control information.

However, at least one of the processors decodes the data unit as conforming to the type of data unit the processor is allocated to identify (or as possibly being a slightly corrupted data unit that has a reasonable likelihood of being the type of data unit the processor is allocated to identify), the processor can so notify the other processors or another processor acting as an arbiter. If the number of processors allocated to process the data unit does not equal the number of types of data units under consideration, the processors may be allocated in an other-than-one-to-one relationship to the types of data units under consideration. As an example, if fewer processors are available than the number of types of data units under consideration, the processors may be allocated to process the data unit as if it were among a subset of the types of data units under consideration. After a processor has determined that the type of data unit according to which it was attempting to process the data unit is not (or is not likely) the actual data unit type of the data unit, the processor may be allocated to process the data unit as if it were another type of data unit among the subset of the types of data units under consideration. By allocating the processors to attempt to uniquely process the data unit according to several types of the subset of types of data units under consideration, a reasonable likelihood that the data unit can be processed appropriately can be achieved. As an example, processors may be allocated to attempt to process the data unit as if were different types of data units exhaustively until attempts to process the data unit according to all types of data units under consideration have been performed. As another example, processors may be allocated to attempt to process the data unit as if it were different types of data units, where the different types of data units are fewer than all types of data units under consideration, and where the different types of data units are chosen randomly. As yet another example, processors may be allocated to attempt to process the data unit as if it were different types of data units, where the different types of data units are fewer than all types of data units under consideration, and where the different types of data units are chosen based on historical statistical criteria as to the frequencies of occurrence of the types of data units under consideration. For example, if the frequency of types of data units, from the most frequent to the least frequent, has historically been in the order HDU, TDU, LDU1, LDU2, and PDU, a first available processor may be allocated to attempt to process the data unit as if it were a HDU, a second available processor may be allocated to attempt to process the data unit as if it were a TDU, and subsequently available processors, which may, for example, be the first available processor after it has finished attempting to process the data unit as if were a HDU, the second available processor after it has finished attempting to process the data unit as if it were a TDU, or one or more other available processors, are allocated to attempt to process the data unit as if it were one or more of an LDU1, an LDU2, or a PDU, in descending order of historical frequency.

In accordance with at least one embodiment, probabilistic analysis of possible values is biased using historical data values. In a standardized communications system, for example, an APCO P25 radio system, implementations of improvements and responses to vulnerabilities can be frustrated by the need to maintain conformance with the standards and interoperability with other communications apparatus manufactured to conform to the standards. Thus, it can be desirable to unilaterally implement a solution that provides fortification against known vulnerabilities without requiring any modification or change of behavior from other apparatus. However, without the cooperation of other apparatus in implementing a solution, it may be difficult, if not impossible, to remove all uncertainty from the system. Accordingly, a probabilistic solution can improve performance even when bounded by such constraints.

To improve the performance of probabilistic analysis of possible values, in accordance with at least one embodiment, known historical values are used as a basis for comparison to any uncertain bits. For example, if practically all communications on a frequency have had a specific network access code (NAC) but a different NAC is received in a network identifier (NID), suspicion of hostile action, for example, jamming, may be considered to be significantly increased. Validity of the bits of the data unit identifier (data unit ID) is also called into question. However, rather than equally considering all possible data unit types, historical data may be used to bias the determination of a likely data unit type. For example, if a frequency has traditionally been used only for voice traffic, not for packet data traffic, the likelihood that an unknown data unit is a packet data unit (i.e., data unit ID=1100) can be discounted. As another example, if the last data unit was a logical link data unit 1 (LDU1), an immediately subsequent unknown data unit can be presumed to be a logical link data unit 2 (LDU2). As another example, if a data unit length is not of a length matching the standard lengths of other types of data units, a data unit can be presumed to be a packet data unit (PDU), as packet data units are of variable length. As yet another example, if an unknown data unit follows a header data unit (HDU), it can be presumed to be a logical link data unit 1 (LDU1) or a packet data unit (PDU). If an unknown data unit is the first data unit of a transmission, it can be presumed to be a header data unit (HDU). If an unknown data unit is the last data unit of a transmission, it can be presumed to be a terminator data unit (TDU). If a presumptive TDU has 28 null bits beginning 30 bits from its end, it can be presumed to be a TDU without link control information. If not, it can be presumed to be a TDU with link control information. Thus, using both attributes of a data unit of unknown type as well as historical information about other data units and positional data about the data unit of unknown type, the type of the data unit of unknown type can be tentatively determined to a high degree of likelihood. By processing the data packet of unknown type as if it were of the tentatively determined type, the tentative determination can be confirmed or rejected. If the tentative determination is rejected, the data packet of unknown type can be processed as if it were of a second most likely type, and so on.

In accordance with at least one embodiment, a probabilistic Turing machine is used to provide error correction for less robustly coded data. While deterministic processing of received information may lead to disregarding information which cannot be ascertained to be accurate, for example, a P25 network identifier with corrupted data unit ID bits, a probabilistic Turing machine randomly choosing values for the corrupted data unit ID bits has at least some non-zero probability of recovering the corrupted bits.

In accordance with at least one embodiment, nondeterministic Turing machine is used to provide error correction for less robustly coded data. In accordance with at least one embodiment, a nondeterministic finite automaton (NFA) is defined. If the precise value of information, such as corrupted bits in a communication cannot be determined with certainty, the outcomes of operations on those corrupted bits may be performed nondeterministically with respect to those bits. Such a nondeterministic technique can provide a non-zero probability of recovering the corrupted bits and can avoid responding to an error in a predictable manner, which can help inhibit, for example, attackers who might attempt to cause a predictable failure mode to occur.

In accordance with at least one embodiment, a quantum Turing machine is used to provide error correction for less robustly coded data. In accordance with at least one embodiment, one or more uncertain bits of the less robustly coded data are represented by quantum bits (qubits). For example, a solid-state quantum memory using phosphorous-31 nuclear spin, such as that developed at Lawrence Berkeley National Laboratory, may be used to store qubits maintaining the superposition of the possible states of the uncertain bits of the less robustly coded data.

In accordance with at least one embodiment, the techniques disclosed herein may be practiced adaptively in response to an indication of unreliability of communication. As an example, a data unit may be processed only as if it were the type of data unit it appears to be if no errors have been detected in recently processed data units. As errors are detected, additional processing resources may be allocated to attempt to process the data unit as if it were different types of data units. The amount of processing resources allocated to attempting to process a data unit may be related to, for example, proportional to, the uncertainty of the type of the data unit for which the attempts to process are to be made. Accordingly, data units whose type is more certain may be processed more efficiently and data units whose type is more uncertain may be processed more robustly.

Figure 9:
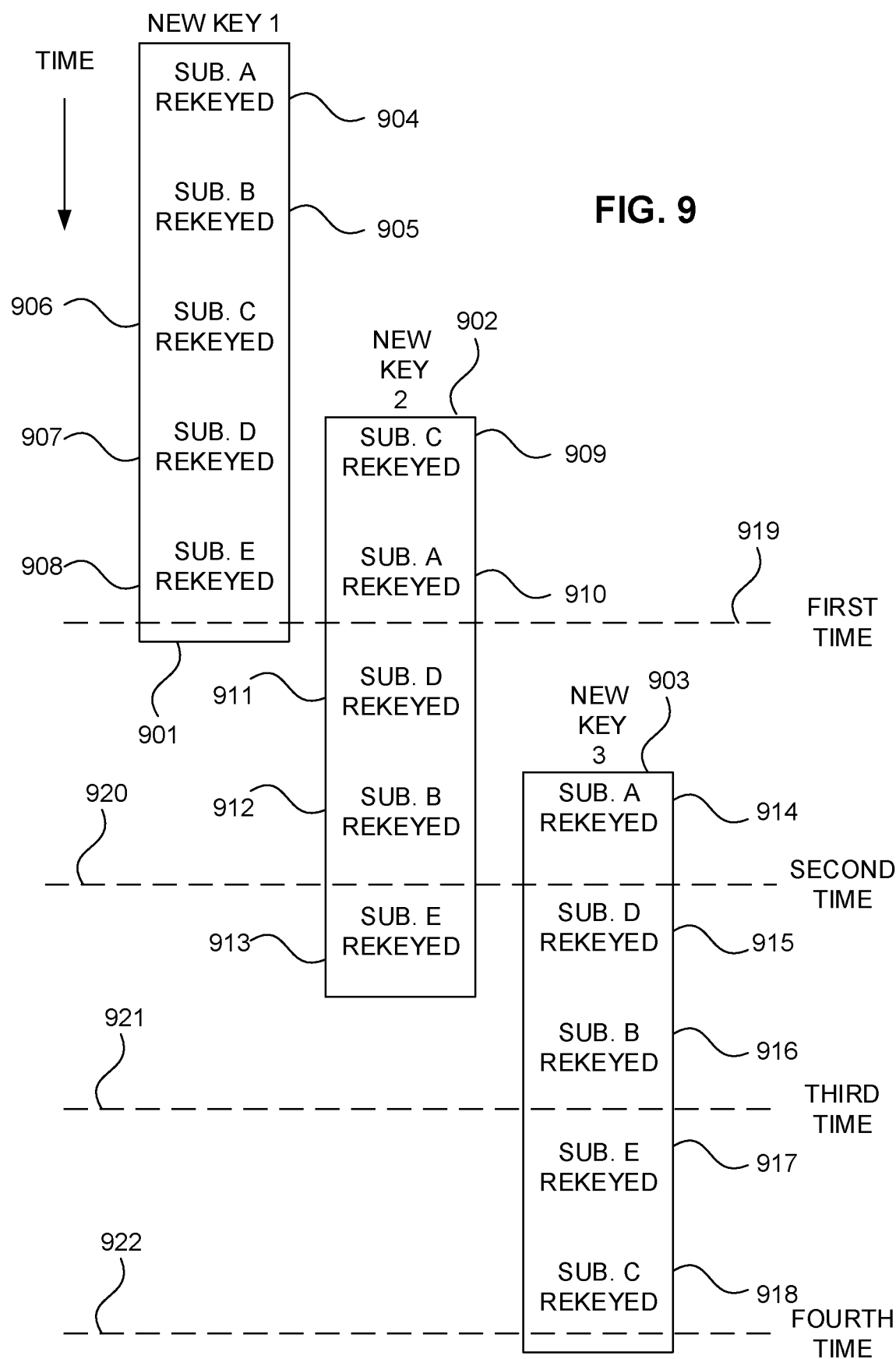
FIG. 9 is a diagram of gradual rekeying in accordance with at least one embodiment.

FIG. 9 is a diagram of gradual rekeying in accordance with at least one embodiment. In the diagram, time progresses from top to bottom. The rekeying begins with a first new key being provided to subscriber equipment over a first time period 901. Then, during a second time period 902 that may or may not at least partially overlap with the first time period 901, a second new key is provided to subscriber equipment. Then, during a third time period 903 that may or may not at least partially overlap with the second time period 902, a third new key is provided to subscriber equipment.

In step 904 of the first time period 901, a subscriber equipment A is rekeyed with the first new key. In step 905 of the first time period 901, a subscriber equipment B is rekeyed with the first new key. In step 906 of the first time period 901, a subscriber equipment C is rekeyed with the first new key. In step 907 of the first time period 901, a subscriber equipment D is rekeyed with the first new key. In step 908 of the first time period 901, a subscriber equipment E is rekeyed with the first new key.

In step 909 of second time period 902, which, as an example, is illustrated as being approximately temporally coincident with step 907 of the first time period 901, subscriber equipment C is rekeyed with the second new key. In step 910 of second time period 902, which, as an example, is illustrated as being approximately temporally coincident with step 908 of the first time period 901, subscriber equipment A is rekeyed with the second new key. In step 911 of second time period 902, which, as an example, is shown as being mutually exclusive in time with any of the steps of first time period 901 and third time period 903, subscriber equipment D is rekeyed with the second new key. In step 912, which, as an example, is illustrated as being approximately temporally coincident with step 914 of the third time period 903, subscriber equipment B is rekeyed with the second new key. In step 913, which, as an example, is illustrated as being approximately temporally coincident with step 915 of the third time period 903, subscriber equipment E is rekeyed with the second new key.

In step 914 of third time period 903, which, as an example, is illustrated as being approximately temporally coincident with step 912 of the second time period 902, subscriber equipment A is rekeyed with a third new key. In step 915 of the third time period 903, which as an example, is illustrated as being approximately temporally coincident with step 913 of the second time period 902, subscriber equipment D is rekeyed with the third new key. In step 916 of the third time period 903, which, as an example, is illustrated as being mutually exclusive in time with any of the steps of the first time period 901 and the second time period 902, subscriber equipment B is rekeyed with the third new key. In step 917 of the third time period 903, which as an example, is illustrated as being mutually exclusive in time with any of the steps of the first time period 901 and the second time period 902, subscriber equipment E is rekeyed with the third new key. In step 918 of the third time period 903, which as an example, is illustrated as being mutually exclusive in time with any of the steps of the first time period 901 and the second time period 902, subscriber equipment C is rekeyed with the third new key.

A first time 919 is, as an example, illustrated as occurring during first time period 901, after the rekeying of subscriber equipment E in step 908, and during second time period 902, after the rekeying of subscriber equipment A in step 910. A second time 920 is, as an example, illustrated as occurring during second time period 902, after the rekeying of subscriber equipment B in step 912, and during third time period 903, after rekeying of subscriber equipment A in step 914. A third time 921 is, as an example, illustrated as occurring during third time period 903, after the rekeying of subscriber equipment B in step 916. A fourth time 922 is, as an example, illustrated as occurring during third time period 904, after the rekeying of subscriber equipment C in step 918.

At first time 919, all five of subscriber equipment A, B, C, D, and E have been rekeyed with new key 1, so any of them may communicate with any other or others of them using new key 1. At first time 919, only subscriber equipment C and subscriber equipment A have been rekeyed with new key 2, so they could communicate with each other using new key 2, but not with any of the other subscriber equipment unless they were to use new key 1. For that reason, in accordance with at least one embodiment, at first time 919, subscriber equipment C may select new key 2 to use with subscriber equipment A if it detects the presence of subscriber equipment A and the absence of the other subscriber equipment. The presence and absence of subscriber equipment may be detected by decoding the radio identifiers (RIDs) of radios with which subscriber equipment C is in communication and comparing the key identifiers (KIDs) those radios are using for their transmissions with the KIDs pertaining to new key 2 and new key 1. If all of the received KIDs pertain to new key 2 (or later keys), a radio may use new key 2 to encrypt transmissions. However, if at least one of the received KIDs pertains to new key 1 instead of new key 2, a radio receiving new key 1 should encrypt its communications with new key 1 to maintain encryption compatible with all radios with which the radio is attempting to communicate.

At second time 920, each of subscriber equipment A, B, C, D, and E has been rekeyed with new key 1. Each of subscriber unit C, A, D, and B have been rekeyed with new key 2, but subscriber equipment E has not. Subscriber equipment A has been rekeyed with new key 3, but no other subscriber equipment has. Thus, any of subscriber equipment A, B, C, D, and E can communicate with any of the other subscriber equipment using new key 1. All of the subscriber equipment except subscriber equipment E can communicate with all of the subscriber equipment except subscriber equipment E using new key 2. None of the subscriber equipment can communicate with any other subscriber equipment using new key 3. For those reasons, in accordance with at least one embodiment, at second time 920, and of the subscriber equipment except subscriber equipment E may select new key 2 to use with any of the other subscriber equipment except subscriber equipment E if it detects the presence of only subscriber equipment other than subscriber equipment E. The presence of subscriber equipment may be detected by decoding the radio identifiers (RIDs) of radios with which subscriber equipment is in communication and comparing the key identifiers (KIDs) those radios are using for their transmissions with the KIDs pertaining to new key 2 and new key 1. If all of the received KIDs pertain to new key 2 (or later keys), a radio may use new key 2 to encrypt transmissions. However, if at least one of the received KIDs pertains to new key 1 instead of new key 2, a radio receiving new key 1 should encrypt its communications with new key 1 to maintain encryption compatible with all radios with which the radio is attempting to communicate.

At third time 921, all of subscriber equipment A, B, C, D, and E have been rekeyed with new key 1 and new key 2. However, subscriber equipment A, D, and B have been rekeyed with new key 3, but subscriber equipment E and C have not. For that reason, in accordance with at least one embodiment, at third time 921, subscriber equipment A, D, or B may select new key 3 to use with subscriber equipment A, D, and/or B if it detects the presence of subscriber equipment A, B, and/or D, but does not detect the presence of subscriber equipment E or C. The presence of subscriber equipment may be detected by decoding the radio identifiers (RIDs) of radios with which subscriber equipment is in communication and comparing the key identifiers (KIDs) those radios are using for their transmissions with the KIDs pertaining to new key 3, new key 2, and new key 1. If all of the received KIDs pertain to new key 3 (or later keys), a radio may use new key 3 to encrypt transmissions. However, if at least one of the received KIDs pertains to new key 2 instead of new key 3, a radio receiving new key 3 should encrypt its communications with new key 2 to maintain encryption compatible with all radios with which the radio is attempting to communicate. If however, at least one of the received KIDs pertains to new key 1 instead of new key 3 or new key 2, a radio should encrypt its transmissions with new key 1 instead of new keys 2 or 3. Since new key 1 is not only older than new key 3, but also older than new key 2, in accordance with at least one embodiment, a warning is provided to the user of the radio preparing to transmit that the radio will be using an older key. In accordance with at least one embodiment, an option is presented to the user not to allow use of the older key, and the radio acts upon the user's response to the option to determine which of new key 2 and new key 3 to use.

At fourth time 922, all of subscriber equipment A, B, C, D, and E have been rekeyed with new key 1, new key 2, and new key 3. For that reason, in accordance with at least one embodiment, at fourth time 922, any of subscriber equipment A, B, C, D, or E may select new key 3 to use with any other subscriber equipment if it detects the presence of subscriber equipment rekeyed with new key 3, but does not detect the presence of subscriber equipment not rekeyed with new key 3. The presence of subscriber equipment may be detected by decoding the radio identifiers (RIDs) of radios with which subscriber equipment is in communication and comparing the key identifiers (KIDs) those radios are using for their transmissions with the KIDs pertaining to new key 3, new key 2, and new key 1. If all of the received KIDs pertain to new key 3 (or later keys), a radio may use new key 3 to encrypt transmissions. However, if at least one of the received KIDs pertains to new key 2 instead of new key 3, a radio receiving new key 3 should encrypt its communications with new key 2 to maintain encryption compatible with all radios with which the radio is attempting to communicate. If however, at least one of the received KIDs pertains to new key 1 instead of new key 3 or new key 2, a radio should encrypt its transmissions with new key 1 instead of new keys 2 or 3. Since new key 1 is not only older than new key 3, but also older than new key 2, in accordance with at least one embodiment, a warning is provided to the user of the radio preparing to transmit that the radio will be using an older key. In accordance with at least one embodiment, an option is presented to the user not to allow use of the older key, and the radio acts upon the user's response to the option to determine which key to use.

In accordance with at least one embodiment, gradual cryptographic rekeying is provided. Cryptographic apparatus typically requires access to appropriate key information in a timely manner. However, since key information can be compromised, and there is more opportunity for compromise of the key information the longer it remains useful, rekeying of cryptographic apparatus is typically performed from time to time. Nonetheless, for example, if a sender of an encrypted message has a new key (having recently been rekeyed) but the recipient of the encrypted message has an old key (not having been rekeyed), the recipient would typically be unable to read the encrypted message. In accordance with at least one embodiment, rekeying is performed gradually with a period of overlap of validity of old and new keys. In accordance with at least one embodiment, a group of users who all have a new key can use a new key to communicate amongst themselves, but a group of users having at least one radio which has not yet been rekeyed is guided to use an old encryption key that they all have in common.

Figure 10:
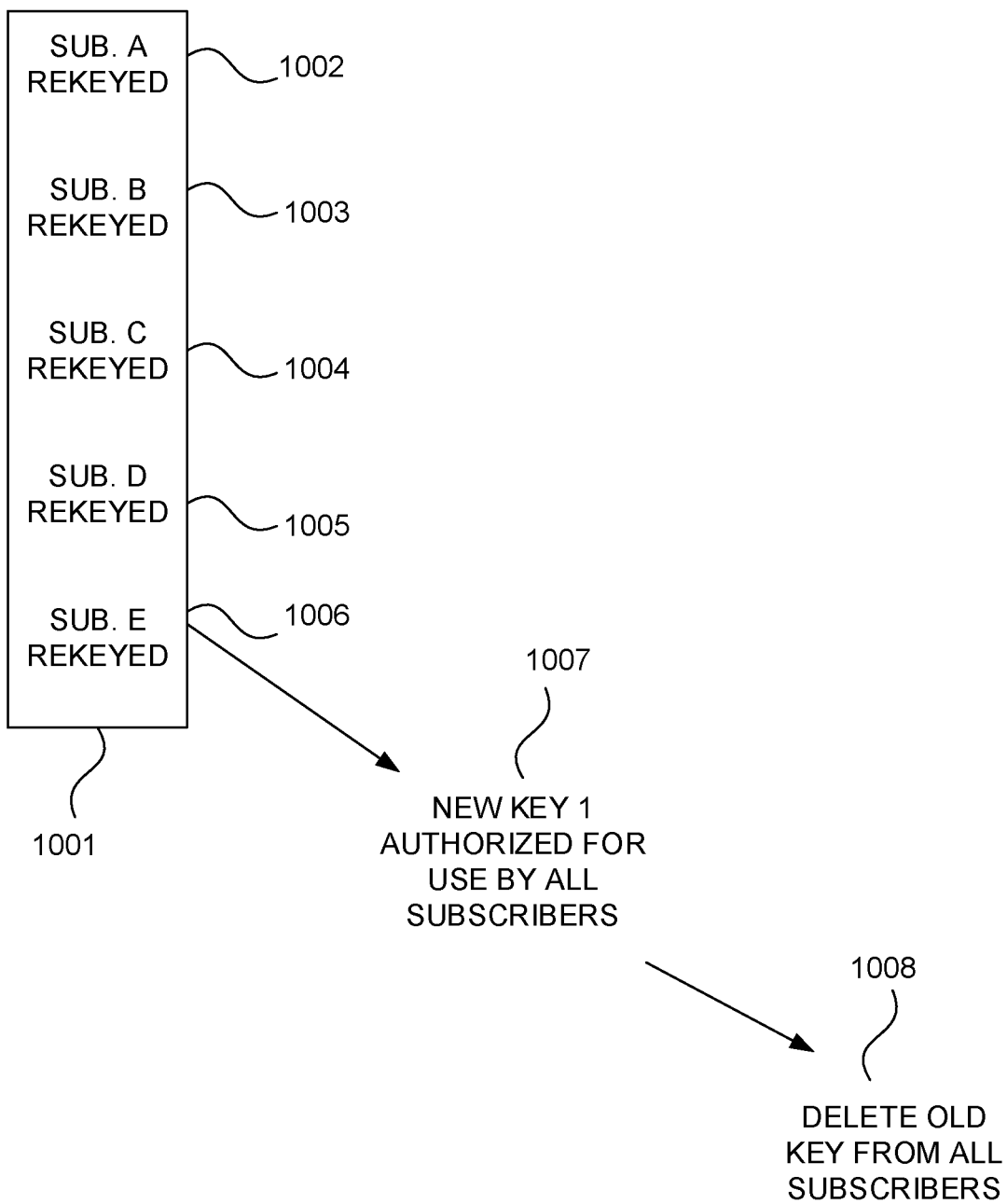
FIG. 10 is a diagram of confirmed stepwise progression rekeying in accordance with at least one embodiment.

FIG. 10 is a diagram of confirmed stepwise progression rekeying in accordance with at least one embodiment. During first time period 1001, in accordance with at least one embodiment, subscriber equipment A is rekeyed with new key 1 in step 1002, subscriber equipment B is rekeyed with new key 1 in step 1003, subscriber equipment C is rekeyed with new key 1 in step 1004, subscriber equipment D is rekeyed with new key 1 in step 1005, and subscriber equipment E is rekeyed with new key 1 in step 1006. During first time period 1001, as subscriber equipment is rekeyed with new key 1, the subscriber equipment is instructed to maintain new key 1 in a pending status, not yet using new key 1 for encrypting user communications. After first time period 1001 has ended, with all subscriber equipment having been rekeyed with new key 1, step 1007 is performed, authorizing all subscriber equipment to begin using new key 1. After all subscriber equipment has been authorized to use new key 1, step 1008 is performed, deleing an old key (e.g., an old key used prior to new key 1) from all subscriber equipment.

In accordance with at least one embodiment, confirmed stepwise progression rekeying is provided. Rather than rekeying being a one-step process for each piece of cryptographic apparatus, where the cryptographic apparatus is either rekeyed and has the new key or is not rekeyed and does not have the new key, a confirmed stepwise progression rekeying technique allows a first subset of a set of cryptographic apparatus to be loaded with a new key while a second subset of the set of cryptographic apparatus is not yet loaded with a new key. Even after the loading of the new key to the first subset of the set of cryptographic apparatus, the first subset of the set of cryptographic apparatus continues to use the old key, as it has not yet received notice of all of the set of cryptographic apparatus having received the new key. As cryptographic apparatus of the second set receive the new key, a key manager maintains a record of which cryptographic apparatus possess the old key and which cryptographic apparatus possess both the old key and the new key. After the entire set of cryptographic apparatus has received the new key, the key manager communicates a message to at least one member of the set that the new key may be used. If the at least one member of the set communicates with another member of the set that has not yet received the message from the key manager, the at least one member of the set may pass the cryptographically authenticatable message to the another member of the set, thereby authorizing the another member of the set to use the new key and to pass on the message to other members of the set. Thus, the transfer of key information may continue to be restricted to highly controlled circumstances while the dissemination of authority to use new key information may be performed in a much more convenient manner at a time and under circumstances that will assure that all cryptographic apparatus that should be able to communicate with each other are able to do so. After receipt of the message authorizing use of the new key, the old key may be deleted without the need for further communications to or from the key server regarding the old key.

Figure 11:
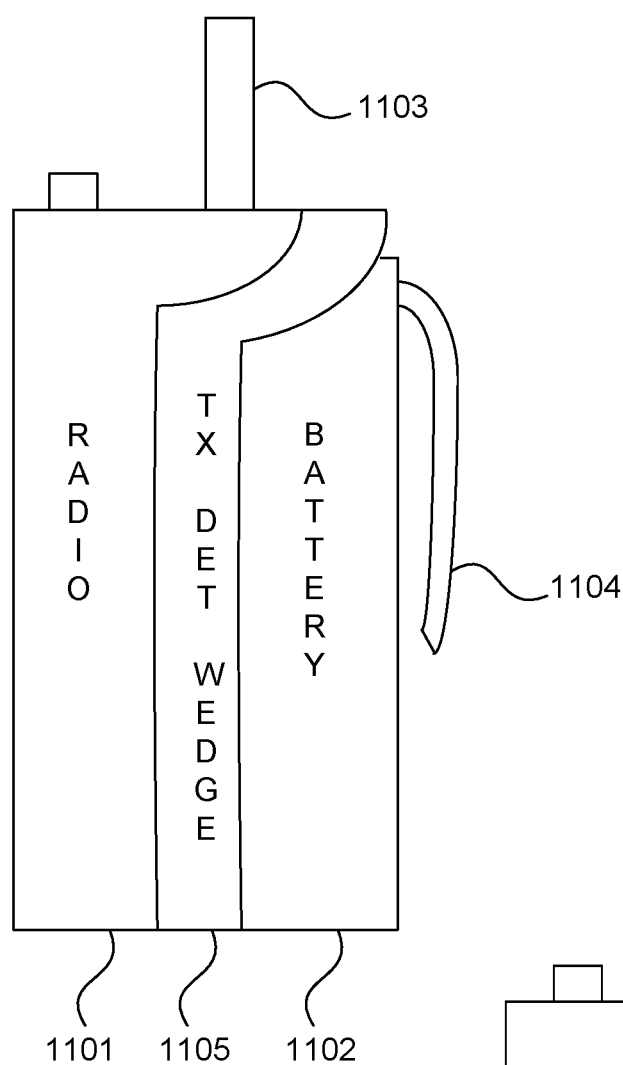
FIG. 11 is a diagram of a transmission detection wedge in accordance with at least one embodiment.

FIG. 11 is a diagram of a transmission detection wedge in accordance with at least one embodiment. In accordance with at least one embodiment, a radio 1101 having an antenna 1103 is coupled to a transmission detection wedge 1105, and the transmission detection wedge 1105 is coupled to a battery 1102 having a belt clip 1104. In accordance with at least one embodiment, a transmission detection wedge 1105 is provided with battery attachment mechanical couplings and battery attachment electrical couplings to couple to a radio 1101 in a manner similar to that in which battery 1102 is typically coupled to radio 1101. In accordance with at least one embodiment, a transmission detection wedge 1105 is provided with radio attachment mechanical couplings and battery attachment electrical couplings to couple to a battery 1102 in a manner similar to that in which radio 1101 is typically coupled to battery 1102. Transmission detection wedge 1105 is interposed between radio 1101 and battery 1102, allowing transmission detection wedge 1105 to receive power from battery 1102, a first portion of such power being provided to radio 1101 to power radio 1101 and a second portion of such power being supplied to transmission detection circuitry in transmission detection wedge 1105.

In accordance with at least one embodiment, the transmission detection wedge 1105 detects radio frequency (RF) energy emitted from radio 1101, providing an indication. In accordance with at least one embodiment, the indication is a visual, audible, and/or vibratory indication. In accordance with at least one embodiment, the transmission detection wedge 1105 measures current flow through the transmission detection wedge 1105 from battery 1102 to radio 1101. For example, the transmission detection wedge 1105 may measure a voltage across a low value resistor in series with the battery 1102 and the radio 1101. In accordance with at least one embodiment, the transmission detection wedge may detect a combination of RF energy emitted from radio 1101 and current flow to radio 1101 to ascertain that radio 1101 is transmitting. In accordance with at least one embodiment, transmission detection wedge 1105 may measure a first duration of a first current flow through the transmission detection wedge 1105 from battery 1102 to radio 1101, wherein the first current flow is characteristic of reception of a malformed data packet. In accordance with at least one embodiment, the transmission detection wedge 1105 may qualify the measurement of the first duration of the first current flow through the transmission detection wedge 1105 by confirming the absence of detection of an RF emission during the first duration of the first current flow. In accordance with at least one embodiment, the transmission detection wedge 1105 may measure a second duration of a second current flow through the transmission detection wedge 1105 from battery 1102 to radio 1101, wherein the second current flow is characteristic of transmission of a negative acknowledgement (NAK) in response to the malformed data packet. In accordance with at least one embodiment, the transmission detection wedge 1105 may qualify the measurement of the second duration of the second current flow through the transmission detection wedge 1105 by confirming the presence of detection of an RF emission during the second duration of the second current flow. In accordance with at least one embodiment, the transmission detection wedge 1105 may qualify the measurements of the first duration of the first current flow and the second duration of the second current flow by assessing a characteristic temporal relationship between the first duration of the first current flow and the second duration of the second current flow. In accordance with at least one embodiment, if the measurements meet the qualification criteria, the transmission detection wedge 1105 provides an alert to a user of the wireless apparatus.

In accordance with at least one embodiment, transmission detection wedge 1105 may characterize a detected transmission before providing an indication. For example, transmission detection wedge 1105 may comprise a microcontroller with a timer to time the duration of a detected transmission to distinguish longer duration transmissions, such as voice transmissions, from shorter duration transmissions, which may include short data transmissions, such as negative acknowledgement (NAK) transmissions, which may be transmitted in response to receipt of a malformed data communication. Thus, in accordance with at least one embodiment, the transmission detection wedge 1105 may emit an indication in response to short data transmissions but not emit an indication in response to other transmissions, such as voice transmissions.

In accordance with at least one embodiment, transmission detection wedge 1105 may receive, demodulate, and decode received transmissions to identify any negative acknowledgement (NAK) transmissions. Since the transmission detection wedge 1105 is coupled to the radio 1101 and is proximate to antenna 1103, a high sensitivity tuned receiver is not required for transmission detection wedge 1105 to receive transmissions from radio 1101. Rather, in accordance with at least one embodiment, a relatively insensitive untuned detector circuit, for example, a detector circuit based on a semiconductor junction such as a germanium, Schottky, or silicon diode may be used to receive transmissions from radio 1101. In accordance with at least one embodiment, a tuned receiver circuit is used to receive transmissions from radio 1101. The tuned receiver circuit may be programmed with a frequency of operation or may operated in a scan or search mode to scan among a plurality of frequencies or to search across a band of frequencies. In accordance with at least one embodiment, a microcontroller in transmission detection wedge 1105 synchronizes itself to a preamble of the transmission, identifies a frame synchronization (FS) sequence, inspects a network identifier (NID) for the presence of a data unit identifier (data unit ID) representative of a packet data unit (PDU), and reads and decodes a PDU to determine if the PDU is a NAK. If the PDU is a NAK, the transmission detection wedge provides an indication, for example, a visual, audible, and/or vibratory indication.

In accordance with at least one embodiment, a technique for providing annunciation of the occurrence of a radio transmission is provided. In accordance with at least one embodiment, an ammeter measures current draw of a radio from its battery or power supply and compares current draw to known current draw values for transmission. When ammeter detects current draw indicative of transmission, the ammeter triggers an indicator, for example, a light emitting diode (LED) visual indicator and/or an eccentric cam motor vibrating audible/tactile indicator. In accordance with at least one embodiment, to obtain measurement of battery current, the apparatus may be housed in an enclosure that connects to the radio's battery connection and that provides a battery connection upon which a battery may be connected. Thus, in accordance with such embodiment, the apparatus may be "wedged" between the battery and the radio, passing battery current through the ammeter and to the radio and using battery power to power the ammeter and annunciator. Accordingly, while such an apparatus may be referred to as a "wedge," it need not be of a geometric wedge shape (i.e., a three dimensional object having an approximately triangular cross section), but may be of any shape that fits between a wireless device and its battery pack (or, as described below, may be enclosed within such battery pack).

In accordance with at least one embodiment, qualification of the ammeter output information is performed. For example, a temporal template of typical current draw for the transmission of a packet requesting retransmission of a P25 data packet (e.g., in P25 packet data mode with a confirmed packet reception option selected) can be stored and compared against a series of current draw measurements over time to see if such a current draw "fingerprint" matches. By qualifying the ammeter output information in such a manner, false alarms of the transmission indication apparatus for normal transmissions can be avoided.

In accordance with at least one embodiment, a radio frequency (RF) signal detector and/or RF field strength meter can be used in place of the ammeter or in conjunction with the ammeter to obtain an indication of transmission. By using an RF signal detector or RF field strength meter in place of the ammeter, direct electrical connection to the radio can be avoided. By using an RF signal detector or RF field strength meter in conjunction with the ammeter, the ammeter can avoid false alarms from RF emitted by nearby radios while the RF signal detector or RF field strength meter can avoid false alarms caused by current drain conditions that might mimic the current drain of transmission.

Figure 12:
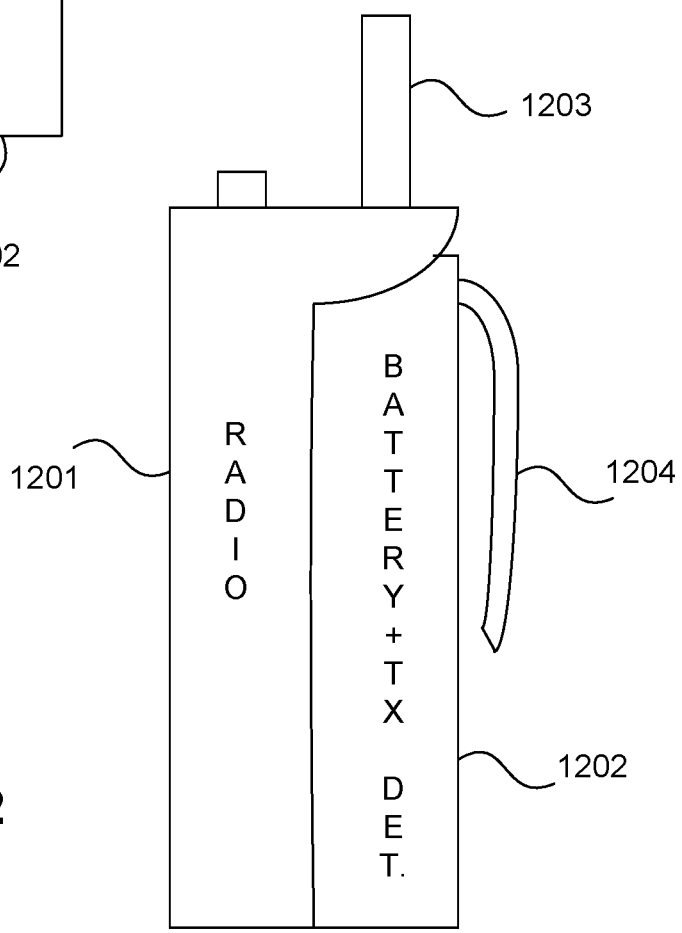
FIG. 12 is a diagram of a battery pack incorporating a transmission detector in accordance with at least one embodiment.

FIG. 12 is a diagram of a battery pack incorporating a transmission detector in accordance with at least one embodiment. In accordance with at least one embodiment, a battery pack incorporating transmission detection circuitry 1202 comprises radio attachment mechanical couplings and radio attachment electrical couplings to mechanically and electrically couple the battery pack incorporating transmission detection circuitry 1202 to radio 1201. In accordance with at least one embodiment, the battery pack incorporating transmission detection circuitry 1202 is coupled to a belt clip 1204. In accordance with at least one embodiment, radio 1201 is coupled to antenna 1203. In accordance with at least one embodiment, the transmission detection circuitry of battery pack incorporating transmission detection circuitry 1202 may be implemented in any of the ways described with respect to the transmission detection wedge 1105 of FIG. 11. In accordance with at least one embodiment, a replacement battery pack may be provided with the ammeter and annunciator integral to the replacement battery pack. Thus, the normal battery pack form factor may be maintained yet the additional transmission indication functionality may be obtained.

Figure 13:
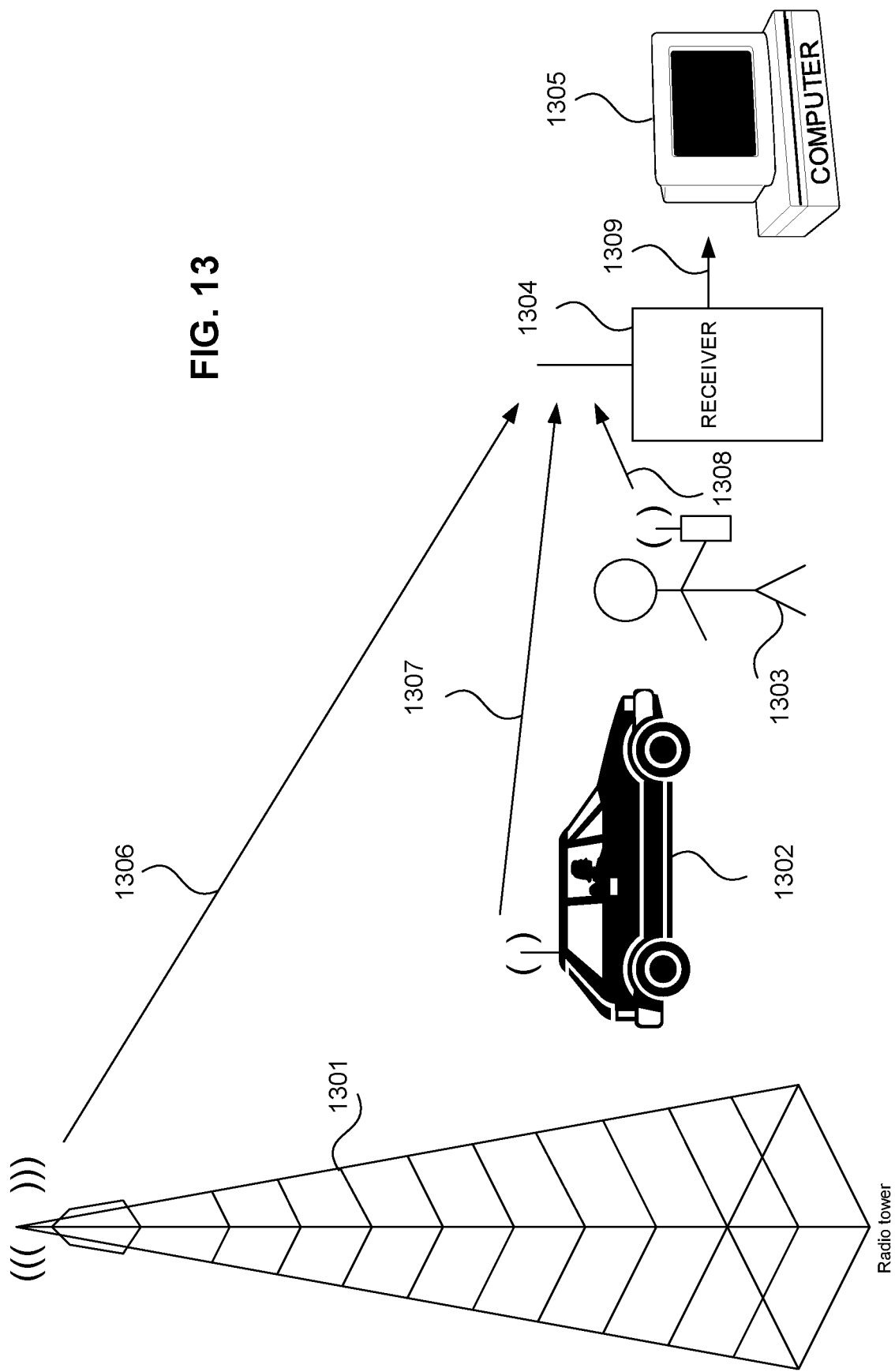
FIG. 13 is a diagram of a system for reporting cryptographic mode utilization in accordance with at least one embodiment.

FIG. 13 is a diagram of a system for reporting cryptographic mode utilization in accordance with at least one embodiment. A receiver 1304 is coupled via coupling 1309 to computer 1305. In accordance with at least one embodiment, receiver 1304 receives signal 1306 from radio tower 1301. In accordance with at least one embodiment, receiver 1304 receives signal 1307 from mobile radio source 1302. In accordance with at least one embodiment, receiver 1304 receives signal 1308 from portable radio source 1303. In accordance with at least one embodiment, the receiver 1309 passes a zero intermediate frequency (zero IF) or near zero IF signal to computer 1305, which receives the signal at an analog input, such as an analog to digital converter (ADC) input, for example, a sound card input, which digitizes the signal into a digital signal. The computer 1305 demodulates and decodes the digital signal to determine the data it conveys. In accordance with at least one embodiment, the computer 1305 implements a frequency translating finite impulse response (FIR) filter to select a particular channel from the input signal. In accordance with at least one embodiment, the computer 1305 implements quadrature demodulation to obtain an FM demodulated channel. In accordance with at least one embodiment, the computer 1305 implements a root raised cosine FIR filter to obtain a filtered data stream. In accordance with at least one embodiment, the computer 1305 implements a four level frequency shift keying (4FSK) demodulator to obtain recovered symbols. In accordance with one embodiment, the computer 1305 compensates for variations in symbol timing, frequency offset, and deviation to assure accurate demodulation of the filtered data stream to accurately obtain the recovered symbols. In accordance with at least one embodiment, the computer converts the symbols (e.g., dibits) into a bit sequence.

In accordance with at least one embodiment, the computer 1305 identifies a frame synchronization (FS) sequence and reads a network identifier (NID), extracting the network access code (NAC) and the data unit ID. In accordance with at least one embodiment, when the data unit ID identifies the data unit as being a header data unit, computer 1305 reads the header code word following the NID, extracting at least one of the message indicator (MI), the manufacturer's identifier (MFID), the algorithm identifier (ALGID), the key identifier (KID), and the talkgroup identifier (TGID). In accordance with at least one embodiment, when the data unit ID identifies the data unit as being a first logical link data unit (LDU1) or a terminator data unit (TDU) with link control, computer 1305 reads the link control information, extracting at least one of the MFID, the source identifier (source ID), and either the TGID or a destination identifier (destination ID). In accordance with at least one embodiment, when the data unit ID identifies the data unit as being a second logical link data unit (LDU2), computer 1305 reads the LDU2, extracting at least one of the MI, the ALGID, and the KID. In accordance with at least one embodiment, based on the extracted information, computer 1305 can examine transmissions having at least one of the same NAC, the same TGID, the same source ID, and the same destination ID, also determining the value of the ALGID and compiling statistical information and/or a detailed log showing the use or non-use of encryption for the at least one of the same NAC, the same TGID, the same source ID, and the same destination ID. Accordingly, for example, if users are employing encryption on a frequency or talkgroup for which unencrypted communications are expected, the anomalous encrypted traffic can be quantified and/or specifically identified, including identification of at least one of its NAC, its TGID, its source ID, its destination ID, its time, its frequency, and its duration. Similarly, for example, if users are failing to employ encryption on a frequency or talkgroup for which encrypted communications are expected, the anomalous encrypted traffic can be quantified and/or specifically identified, including identification of at least one of its NAC, its TGID, its source ID, its destination ID, its time, its frequency, and its duration. As an example, such expectations can be determined empirically based on historical monitoring. As another example, such expectations can be determined based on examination of radio programming information, which may, for example, specify encryption policies for radio equipment. For example, if the radio programming information shows that a radio should be strapped to secure (i.e., should transmit only in an encrypted mode) for a particular frequency or talkgroup, an expectation that encryption is to be employed for that particular frequency or talkgroup may be determined. As another example, such expectations can be explicitly stated through a user interface or by loading a configuration file. In accordance with at least one embodiment, a technique for reporting cryptographic mode utilization is provided. In accordance with at least one embodiment, reporting of cryptographic mode utilization is provided on a per frequency basis. In accordance with at least one embodiment, reporting of cryptographic mode utilization is provided on a per talkgroup basis. In accordance with at least one embodiment, a source ID of the source of a transmission having a specified cryptographic mode is identified. In accordance with at least one embodiment, reporting of usage patterns over time is provided.

In accordance with at least one embodiment, a P25-capable radio receiver, such as a Uniden BCD396XT, Uniden BCD996XT, Uniden BCD396T, Uniden BCD 996T, GRE PSR-500, GRE PSR-600, Radio Shack PRO-106, Radio Shack PRO-197, Ettus Research Universal Software Radio Peripheral (USRP), or a non-P25-capable radio receiver configured to provide unfiltered baseband audio output is coupled to a computer. The computer may be a general purpose computer, such as a personal computer (PC), or a special purpose computer, such as an embedded processor configured in firmware to perform specialized functions. In the case of a general purpose computer, software is loaded into the general purpose computer to transform it to operate as a special purpose computer, performing specialized functions. A level converting interface, such as a 3.3V logic to RS-232 interface or a 3.3V logic to USB interface, may be used to couple the P25-capable radio receiver to the computer. A 3.3V logic to RS-232 interface may be purchased commercially or may be built using an RS-232 level converter, such as a MAX-232 RS-232 level converter. A 3.3V logic to USB interface may be purchased commercially or may be built using a USB interface circuit, such as the FTDI FT-232 USB interface circuit.

Each header data unit (HDU) of P25 traffic comprises an 8 bit algorithm identifier (ALGID), a 16 bit key identifier (KID), and an 8 bit manufacturer's identifier (MFID). When talkgroups are defined, each header data unit (HDU) also comprises a 16 bit talkgroup identifier (TGID). A link control word field of a logical link data unit 1 (LDU1) of P25 traffic may comprise, for example, a MFID, a TGID, a source ID, and/or a destination ID. Each encryption sync word field of a logical link data unit 2 (LDU2) of P25 traffic comprises an ALGID and a KID. Each terminator data unit (TDU) comprises a 48 bit frame synchronization (FS) sequence and a 64 bit network identifier (NID).

As the P25-capable radio receiver receives P25 traffic, it passes digital representations of parameters described above to the computer to which it is coupled. The computer generates a database entry for a transmission comprising database entry values representative of the transmission's ALGID and at least one other parameter selected from a group consisting of: TGID, source ID, destination ID, MFID, and KID. The computer identifies discrepancies, such as the presence of an ALGID having a value of 80 hexadecimal (128 decimal), which denotes unencrypted transmissions, on a talkgroup or frequency over which only encrypted communications are intended to be communicated. For example, the computer can obtain the ALGID and TGID information from the HDU provided to it by the P25-capable radio receiver. In a system not utilizing TGIDs, the computer can be configured to identify a radio frequency of a conventional P25 transmission based on a radio frequency to which the P25-capable radio receiver is configured to operate. By including the received source ID in the database entry, a specific radio can be associated with the database entry.

As another example, the computer can identify discrepancies, such as the presence of an ALGID having a value other than 80 hexadecimal (128 decimal) on a talkgroup or frequency over which only unencrypted communications are intended to be communicated. By including the received source ID in the database entry, a specific radio can be associated with the database entry. Other examples include reporting of unencrypted and/or encrypted transmissions on a per source ID basis to allow auditing of encryption usage of any specific radio. By including the TGID in the database entry, encryption usage of that specific radio can be sorted by talkgroup. By including the frequency in the database entry, encryption usage of that specific radio can be sorted by frequency.

Figure 14:
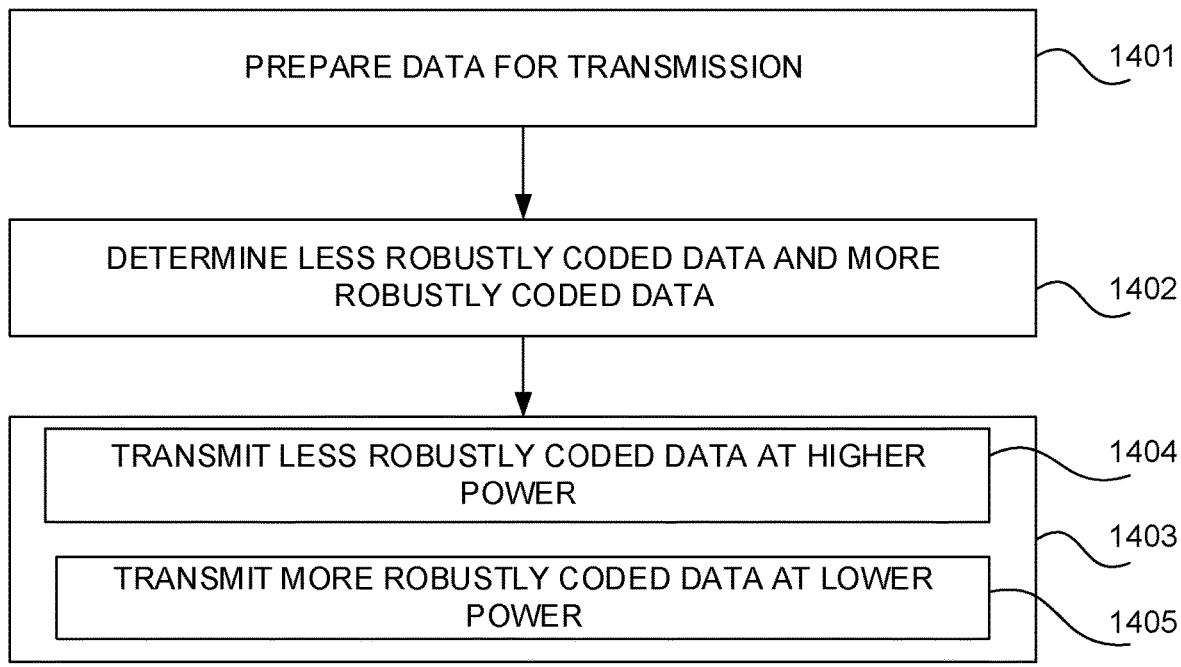
FIG. 14 is a flow diagram of a method for improving reliability of transmission of data comprising less robustly coded data and more robustly coded data in accordance with at least one embodiment.

FIG. 14 is a flow diagram of a method for improving reliability of transmission of data comprising less robustly coded data and more robustly coded data in accordance with at least one embodiment. The method begins in step 1401, where the data to be transmitted is prepared for transmission. From step 1401, the method continues in step 1402 by determining which of the data to be transmitted are less robustly coded and which of the data to be transmitted are more robustly coded. From step 1402, the method continues in step 1403 by transmitting the data. Step 1403 comprises steps 1404 and 1405. In step 1404, less robustly coded data is transmitted at higher power. In step 1405, more robustly coded data is transmitted at lower power. In accordance with at least one embodiment, steps 1404 and 1405 may be performed in either order depending on the temporal occurrence of less robustly coded data and more robustly coded data in the data being transmitted. In accordance with at least one embodiment, steps 1404 and 1405 may be repeated in any order depending on the temporal occurrence of multiple instances of less robustly coded data and more robustly coded data in the data being transmitted.

Figure 15:
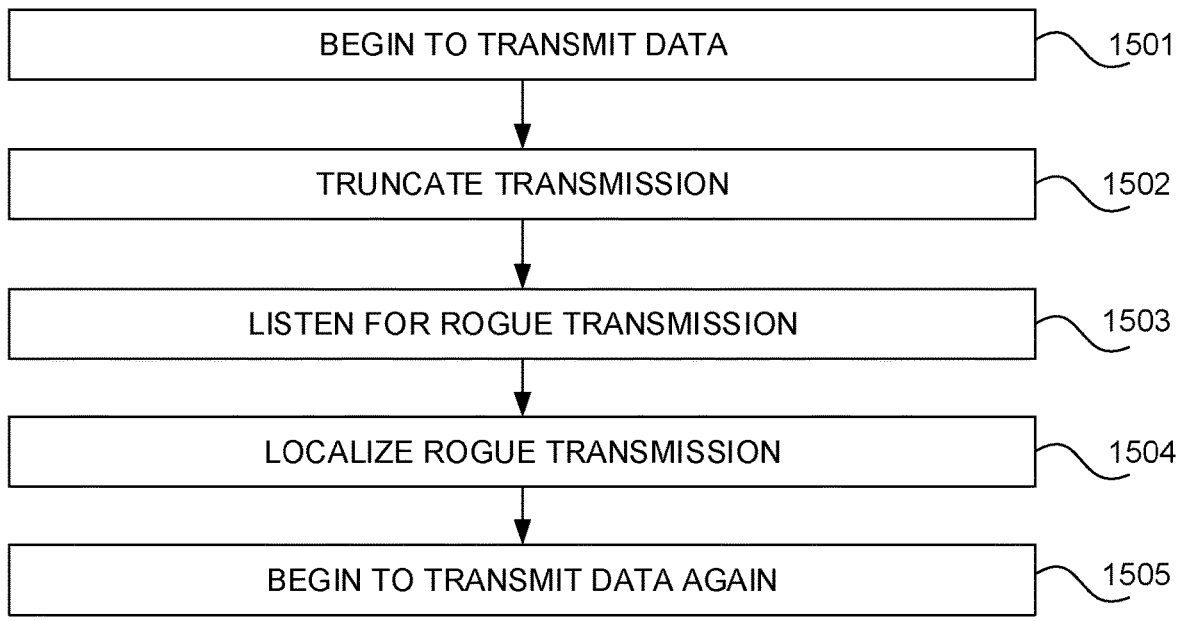
FIG. 15 is a flow diagram of a method for a jamming countermeasure for data transmission in accordance with at least one embodiment.

FIG. 15 is a flow diagram of a method for a jamming countermeasure for data transmission in accordance with at least one embodiment. The method begins in step 1501 by beginning to transmit data. From step 1501, the method continues to step 1502, where the transmission is truncated before an entire data unit defined by the transmission protocol has been transmitted. In accordance with at least one embodiment, the transmission is truncated during or after transmission of the frame synchronization (FS) sequence. From step 1502, the method continues to step 1503 by listening for a rogue transmission. In accordance with at least one embodiment, the transceiver is immediately switched from transmit mode to receive mode and any rogue transmission on the same frequency is received. From step 1503, the method continues to step 1504 by localizing the rogue transmission. In accordance with at least one embodiment, a direction finding technique or other localization technique, such as time difference of arrival (TDOA), is used to localize the rogue transmission. From step 1504, the method continues to step 1505, where the transceiver begins to transmit data again. In accordance with at least one embodiment, the transceiver begins again at the beginning of the data transmission. For example, in accordance with at least one embodiment, the transceiver begins again by transmitting the frame synchronization (FS) sequence. In accordance with at least one embodiment, the transceiver continues to transmit the entire data unit. In accordance with at least one embodiment, the transceiver again truncates the transmission and listens for any rogue transmissions.

In accordance with at least one embodiment, if data gathered in accordance with the foregoing shows that rogue transmissions are occurring only during certain parts of a transmission, for example, only during data unit identifiers for LDU1*s* and LDU2*s*, the technique may be modified to truncate transmission during or slightly before the NID or data unit ID of only LDU1*s* and LDU2*s*, then to listen for rogue transmissions after such truncations. Thus, for example, localization resources may be utilized more efficiently toward occurrences of rogue transmissions, optimizing the localization process.

Figure 16:
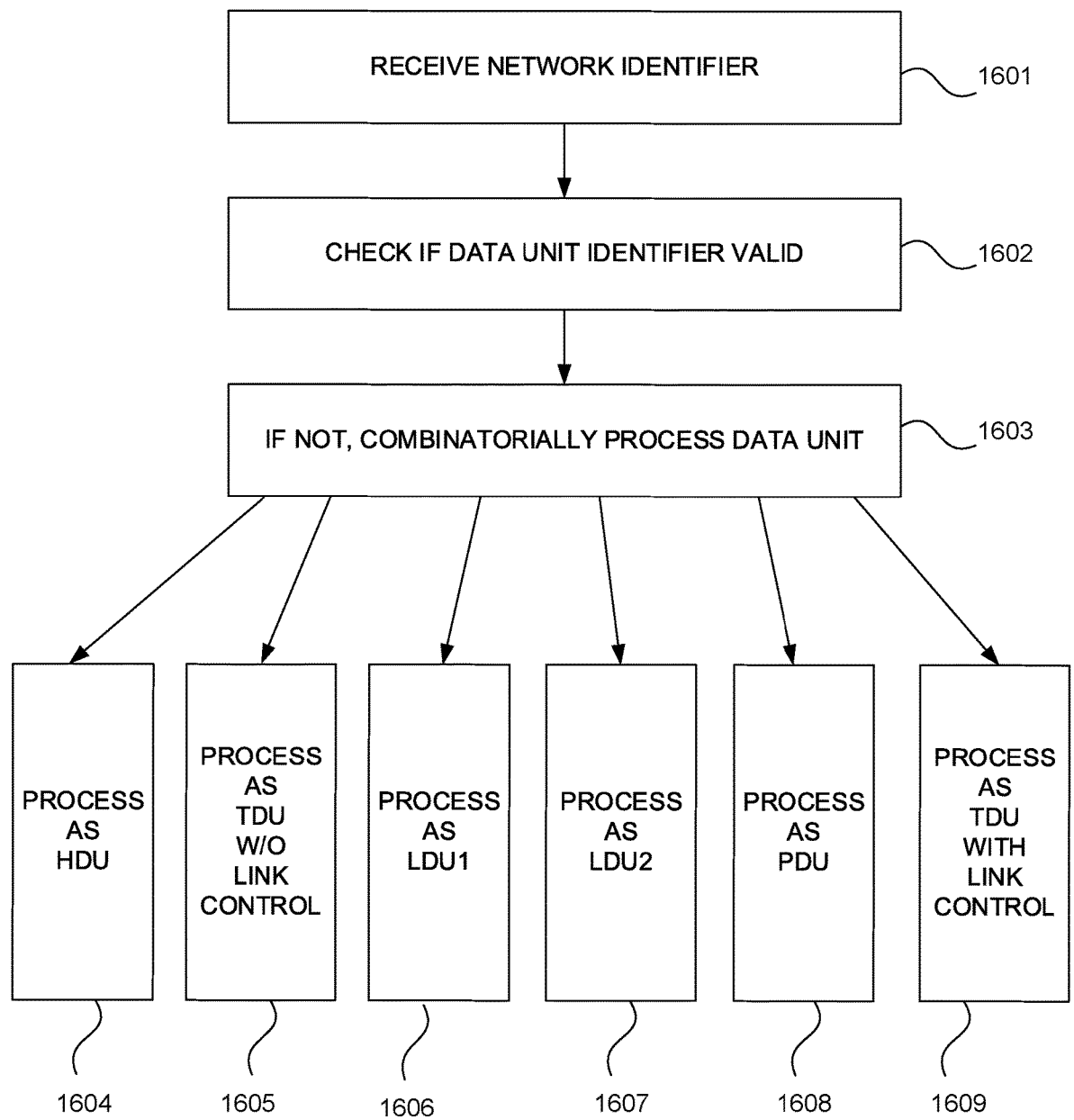
FIG. 16 is a flow diagram of a method for combinatorially processing an uncertain network identifier in accordance with at least one embodiment.

FIG. 16 is a flow diagram of a method for combinatorially processing an uncertain network identifier in accordance with at least one embodiment. The method begins in step 1601 by receiving a network identifier (NID). From step 1602, the method continues to step 1602, checking if the NID is valid. If the NID is valid, the method continues to process the data unit according to the data unit type identified by the data unit identifier (data unit ID) portion of the NID. However, if the NID is not valid, the method continues from step 1602 to step 1603, combinatorially processing the received data unit to which the NID pertains. In accordance with at least one embodiment, step 1603 may lead to at least two of steps 1604, 1605, 1606, 1607, 1608, and 1609. In step 1604, the received data unit is processed as if it were a header data unit (HDU). In step 1605, the received data unit is processed as if it were a terminator data unit (TDU) without link control information. In step 1606, the received data unit is processed as if it were a first type of logical link data unit (LDU1). In step 1607, the received data unit is processed as if it were a second type of logical link data unit (LDU2). In step 1608, the received data unit is processed as if it were a packet data unit (PDU). In step 1609, the received data unit is processed as if it were a terminator data unit (TDU) with link control information.

Following whichever of steps 1604, 1605, 1606, 1607, 1608, and 1609 were performed, the method continues to step 1610, where the most likely data unit type of the received data unit is determined. In accordance with at least one embodiment, the determination of the most likely data unit type of the received data unit is performed using purely intrinsic data that is purely intrinsic to the data unit, purely extrinsic data that is purely extrinsic to the data unit, or both intrinsic data that is intrinsic to the data unit and extrinsic data that is extrinsic to the data unit. For example, in accordance with at least one embodiment, if the processing of the received data unit as if it were a particular type of data unit results in coding errors (e.g., Golay coding errors, Reed-Solomon coding errors, Hamming coding errors, and/or Trellis coding errors) or parity bit errors that prevent recovery of the data unit as a particular type of data unit, that type of data unit is deemed to be an unlikely type of data unit for the received data unit. As another example, in accordance with at least one embodiment, if the processing of a received data unit as if it were a header data unit (HDU), which is supposed to comprise a manufacturer's identifier (MFID), an algorithm identifier (ALGID), a key identifier (KID), and a talkgroup identifier (TGID), results in a value for the MFID inconsistent with MFIDs of existing equipment manufacturers, the likelihood of the data unit being a header data unit (HDU) is deemed to be reduced. As another example, in accordance with at least one embodiment, if the processing of the received data unit as if it were a header data unit (HDU) results in a value for the ALGID inconsistent with ALGIDs of existing algorithms, the likelihood of the data unit being a header data unit (HDU) is deemed to be reduced. As another example, in accordance with at least one embodiment, if the processing of the received data unit as if it were a header data unit (HDU) results in a value for the MFID inconsistent with any MFIDs stored in a cache of previously received MFIDs, the likelihood of the data unit being a header data unit (HDU) is deemed to be reduced. As another example, in accordance with at least one embodiment, if the processing of the received data unit as if it were a header data unit (HDU) results in a value for the ALGID inconsistent with any ALGID stored in a cache of previously received ALGIDs, the likelihood of the data unit being a header data unit (HDU) is deemed to be reduced. As another example, in accordance with at least one embodiment, if the processing of the received data unit as if it were a header data unit (HDU) results in a value for the TGID inconsistent with any TGID stored in a cache of previously received TGIDs, the likelihood of the data being a header data unit (HDU) is deemed to be reduced. As another example, in accordance with at least one embodiment, if the processing of the received data unit as if it were a header data unit (HDU) results in a value for the KID inconsistent with any KID stored in a cache of previously received KIDs, the likelihood of the data unit being a header data unit is deemed to be reduced. In accordance with at least one embodiment, at least one cache of previously received parameter values may be noise filtered by requiring a particular parameter value to have been received several times before it is deemed to have been received so as to prevent a single spurious occurrence of a particular parameter value from allowing future instances of the same parameter value to be sufficient to characterize a data unit as being likely to be a particular type of data unit.

As another example, in accordance with at least one embodiment, if the processing of the received data unit as if it were a first type of logical link data unit (LDU1), which is supposed to comprise a MFID, a source identifier (source ID), and either a TGID or a destination identifier (destination ID), depending on the value of a link control format (LCF) octet, results in a value of the MFID inconsistent with existing equipment manufacturer MFIDs, the likelihood of the data unit being a LDU1 is deemed to be reduced. As another example, in accordance with at least one embodiment, if the processing of the received data unit as if it were a LDU1 results in a MFID inconsistent with any MFID stored in a cache of received MFIDs, the likelihood of the data unit being a LDU1 is deemed to be reduced. As another example, in accordance with at least one embodiment, if the processing of the received data unit as if it were a LDU1 results in a source ID inconsistent with any source ID stored in a cache of previously received source IDs, the likelihood of the data unit being a LDU1 is deemed to be reduced. As another example, in accordance with at least one embodiment, if the processing of the received data unit as if it were a LDU1 results in a LCF octet identifying the LDU1 as comprising a TGID, but the TGID is inconsistent with any TGID stored in a cache of received TGIDs, the likelihood of the data unit being a LDU1 is deemed to be reduced. As another example, in accordance with at least one embodiment, if the processing of the received data unit as if it were a LDU1 results in a LCF octet identifying the LDU1 as comprising a destination ID, but the destination ID is inconsistent with any destination ID stored in a cache of previously received destination IDs, the likelihood of the data unit being a LDU is deemed to be reduced.

As another example, in accordance with at least one embodiment, if the processing of the received data unit as if it were a LDU2, which is supposed to comprise an ALGID and a KID, results in an ALGID inconsistent with any currently defined ALGID, the likelihood of the received data unit being a LDU2 is deemed to be reduced. As another example, in accordance with at least one embodiment, if the processing of the received data unit as if it were LDU2 results in an ALGID inconsistent with any ALGID stored in a cache of previously received ALGIDs, the likelihood of the received data unit being a LDU2 is deemed to be reduced. As another example, in accordance with at least one embodiment, if the processing of the received data unit as if it were a LDU2 results in a KID inconsistent with any KID stored in a cache of previously received KIDs, the likelihood of the received data unit being a LDU2 is deemed to be reduced.

As another example, in accordance with at least one embodiment, if the processing of the received data unit as if it were a TDU without link control information, which is supposed to end with 28 null bits, results in the last 28 bits not being null bits (e.g., at least one of the last 28 bits not having an identical binary value (e.g., a zero value)), the likelihood of the received data unit being a TDU without link control information is deemed to be reduced. As another example, in accordance with at least one embodiment, if the processing of the received data unit as if it were a TDU with link control information, which is supposed to comprise a LCF octet, a MFID, a source ID, and either a TGID or a destination ID, depending on the value of the LCF octet, results in a MFID inconsistent with any existing equipment manufacturer MFIDs, the likelihood of the received data unit being a TDU with link control information is deemed to be reduced. As another example, in accordance with at least one embodiment, if the processing of the received data unit as if it were a TDU with link control information results in a MFID inconsistent with any MFID stored in a cache of previously received MFIDs, the likelihood of the received data unit being a TDU with link control information is deemed to be reduced. As another example, in accordance with at least one embodiment, if the processing of the received data unit as if it were a TDU with link control information results in a source ID inconsistent with any source ID stored in a cache of previously received source IDs, the likelihood of the received data unit being a TDU with link control information is deemed to be reduced. As another example, in accordance with at least one embodiment, if the processing of the received data unit as if it were a TDU with link control information were to result in a LCF octet identifying the received data unit as comprising a TGID but the TGID was inconsistent with any TGID stored in a cache of previously received TGIDs, the likelihood of the received data unit being a TDU with link control is deemed to be reduced. As another example, in accordance with at least one embodiment, if the processing of the received data unit as if it were a TDU with link control information were to result in a LCF octet identifying the received data unit as comprising a destination ID, but the destination ID was inconsistent with any destination ID stored in a cache of previously received TGIDs, the likelihood of the received data unit being a TDU with link control is deemed to be reduced. As another example, in accordance with at least one embodiment, if the processing of the received data unit as if it were a TDU with link control but the LCF octet was not a valid value for a LCF octet (e.g., not a hexadecimal 0x00 denoting the presence of a TGID and not a hexadecimal 0x03 denoting the presence of a destination ID), the likelihood of the received data unit being a TDU with link control information is deemed to be reduced.

In accordance with at least one embodiment, if the processing in step 1604 of the received data unit as if it were an HDU, the processing in step 1605 of the received data unit as if it were a TDU without link control information, the processing in step 1606 of the received data unit as if it were a LDU1, the processing in step 1607 of the received data unit as if it were a LDU2, and the processing in step 1609 of the received data unit as if it were a TDU with link control information were all to indicate a low likelihood of the received data unit being a HDU, a TDU without link control information, a LDU1, a LDU2, or a TDU with link control information, the received data packet may be presumed to be a PDU. The PDU may be forwarded to a higher layer process, for example a TCP/IP stack, for processing to further qualify its likelihood of being a PDU. In accordance with at least one embodiment, the processing of the received data unit as if it were a PDU in step 1608 may be conditioned upon the completion of processing of steps 1604, 1605, 1606, 1607, and 1609.

As another example, in accordance with at least one embodiment, the processing of the received data unit as if it were a PDU may be performed by a higher layer process, for example a TCP/IP stack, may be performed in step 1608 without being conditioned upon the completion of processing of steps 1604, 1605, 1606, 1607, and 1609. In accordance with at least one embodiment, the higher layer process may provide an indication of the likelihood of the received data unit being a PDU, and that likelihood of the received data unit being a PDU can be compared to the likelihoods of the received data unit being a HDU, a TDU without link control information, a LDU1, a LDU2, and a TDU with link control information, as determined based on processing performed in steps 1604, 1605, 1606, 1607, and 1609 to determine the most likely data unit type of the received data unit.

In accordance with at least one embodiment, as processing of data units with valid NIDs can occur without the need for combinatorial processing, caches of previously received parameter values can be created and maintained without a new parameter value (i.e., a parameter value that had not previously been received) causing a the likelihood of the data unit type of the data unit in which it is initially received to be deemed to be reduced, provided the NID for that data unit is valid. In accordance with at least one embodiment, the validity of a NID can be determined by verifying the parity bit that corresponds to the NID. In accordance with at least one embodiment, the validity of a NID can be determined by successfully decoding the BCH code with which the NID is encoded. In accordance with at least one embodiment, the validity of a NID can be determined by checking the data unit ID value against a list of all possible valid data unit ID values. For example, in accordance with at least one embodiment, a data unit ID for a HDU has a data unit ID value of binary 0b0000, a data unit ID for a TDU without link control information has a data unit ID value of binary 0b0011, a data unit ID for a LDU1 has a data unit ID value of binary 0b0101, a data unit ID for a LDU2 has a data unit ID value of binary 0b1010, a data unit ID for a PDU has a data unit ID value of binary 0b1100, and a data unit ID for a TDU with link control information has a data unit ID value of binary 0b1111. As the other ten possible data unit ID values are reserved for use in trunking systems and other systems, the validity of NIDs in trunking systems and other systems can be compared against an expanded list of all possible valid data unit ID values for such trunking systems and other systems. In accordance with at least one embodiment, the checking of a data unit ID value against a list of all possible valid data unit ID values (either with or without additional possible valid data unit ID values for trunking systems and/or other systems) can be combined with checking of the parity bit which applies to them.

In accordance with at least one embodiment, the validity of a data unit ID value can be determined by first attempting to process the data unit to which the data unit ID pertains according to the appropriate process for processing a data unit of the data unit type identified by the data unit ID. For example, processing of the type described with respect to step 1604, 1605, 1606, 1607, or 1609 can be performed on the data unit with the selection between the processing of step 1604, 1605, 1606, 1607, and 1609 being made on the basis of the data unit type identified by the data unit ID corresponding to the data unit. If such processing does not yield a valid result, then combinatorial processing can be performed, as described beginning with step 1603.

In accordance with at least one embodiment, when several indicia discussed with respect to steps 1604, 1605, 1606, 1607, 1608, and 1609 indicated a lowering (or heightening) of the likelihood of a data unit being a particular type of data unit, quantitative adjustments can be made to a plurality of likelihoods corresponding to the plurality of data unit types so as to allow quantitative comparison of the likelihoods of a data unit being a particular type of data unit. In accordance with at least one embodiment, if the quantitative adjustments lack sufficiently fine granularity to establish unambiguously different likelihoods among the possible data unit types with respect to a particular received data unit, a stochastic process may be applied to resolve any tie scores of likelihoods. For example, in accordance with at least one embodiment, a Bernoulli trial may be performed to select between similar likelihoods of different data unit types. The Bernoulli trial may be unweighted (i.e., having equal probability among the possible outcomes) or weighted in accordance with criteria such as a historical incidence of each of the different data unit types. For example, if data units of a first data unit type typically occur twice as frequently as data units of a second data unit type, the Bernoulli trial may be weighted so as to give the first data unit type a ⅔ chance of being selected while giving the second data unit type a ⅓ chance of being selected (in the case of those two data unit types being the only data unit types considered to be most likely based on the combinatorial processing).

In accordance with at least one embodiment, analysis of data units received with certainty and data units received with at least one uncertain bit is performed. For example, if a typical proportion of HDUs is being received with certainty (i.e., without at least one uncertain bit) but very few, if any, LDU1*s* and LDU2*s* are being received with certainty, and traffic analysis of the transmissions indicates they are likely to be voice transmissions (e.g., lengths of the transmissions are consistent with possible concatenations of data units, such as LDU1*s* and LDU2*s*, included in a voice transmission), it may be surmised that some or all of the data units received with at least one uncertain bit are likely LDU1*s* and/or LDU2*s* but not likely HDUs. Accordingly, combinatorial processing of an uncertain data unit may be limited to processing the uncertain data unit as if it were an LDU1 and processing the uncertain data unit as if it were an LDU2, then selecting a most likely data unit type from among an LDU1 and an LDU2. When a most likely data unit type is selected, any uncertain data unit identifier bits may be reconstructed to correspond to the most likely data unit type. In accordance with at least one embodiment, any uncertain network access code (NAC) bits may be reconstructed from a typical NAC, which may, for example, be a recently received NAC or a NAC known to be typically used for transmissions received on the same frequency on which the uncertain data unit was received. Thus, the most likely content of the uncertain data unit may be reconstructed, allowing other processes processing the uncertain data unit to process a seemingly valid reconstructed data unit, thereby preventing such other processes from rejecting the uncertain data unit as an unreadable data unit.

Figure 17:
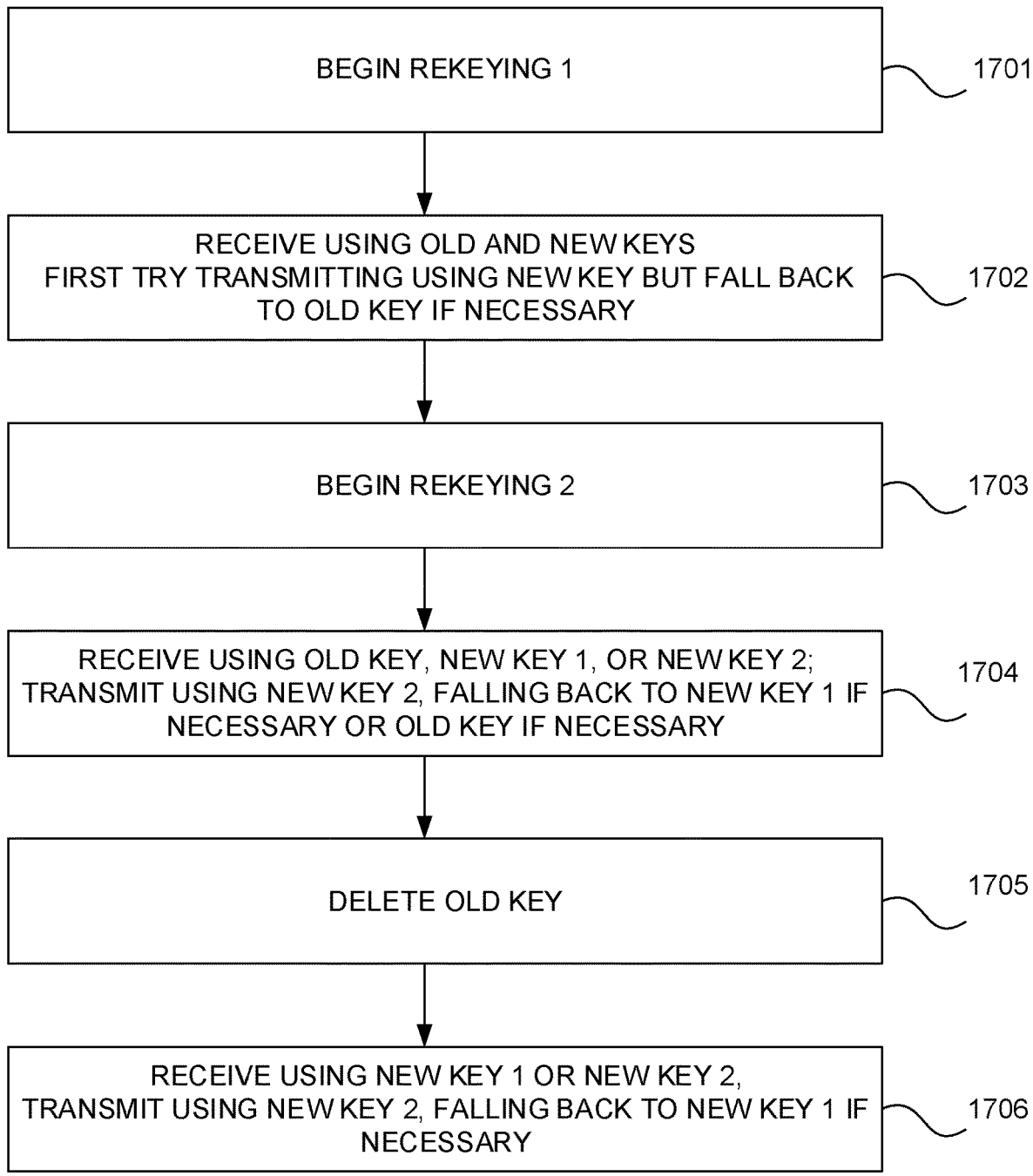
FIG. 17 is a flow diagram of a method of gradual rekeying in accordance with at least one embodiment.

FIG. 17 is a flow diagram of a method of gradual rekeying in accordance with at least one embodiment. The method begins in step 1701 by beginning a first rekeying of subscriber equipment with a first new key. From step 1701, the method continues to step 1702, where reception of signals using an old key or the first new key is permitted and performed, while transmission is first attempted using the first new key, but transmission falls back to using the old key if the attempted transmission using the first new key is not successful. From step 1702, the method continues to step 1703 by beginning the rekeying of subscriber equipment with a second new key. From step 1703, the method continues to step 1704, where reception of signals using the old key, the first new key, or the second new key is permitted and performed, while transmission is first attempted using the second new key, but transmission falls back to using the first new key if the attempted transmission using the second new key is not successful and further falls back to using the old key if the attempted transmission using the first new key is not successful. From step 1704, the method continues to step 1705 by deleting the old key. From step 1705, the method continues to step 1706, where reception of signals using the first new key or the second new key is permitted and performed, while transmission is first attempted using the second new key, but transmission falls back to using the first new key if the attempted transmission using the second new key is not successful.

Figure 18:
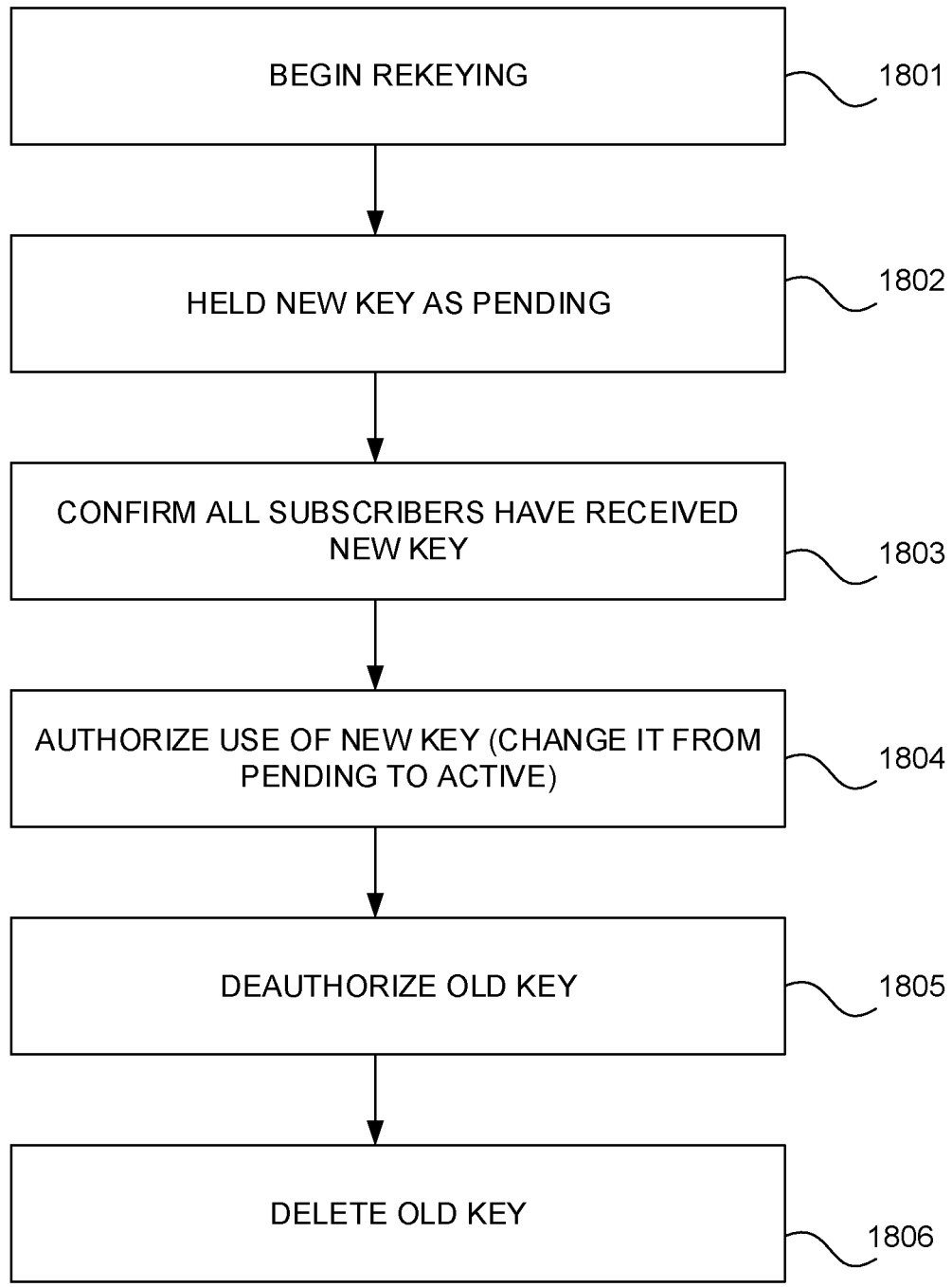
FIG. 18 is a flow diagram of a method of confirmed stepwise progression rekeying in accordance with at least one embodiment.

FIG. 18 is a flow diagram of a method of confirmed stepwise progression rekeying in accordance with at least one embodiment. The method begins in step 1801 by beginning rekeying of subscriber equipment using a new key. The method continues to step 1802, where the new key is held as pending (i.e., subscriber equipment does not attempt transmissions using the new key yet even after the subscriber equipment has been rekeyed with the new key). From step 1802, the method continues to step 1803, where confirmation is obtained that all subscriber equipment has received the new key. From step 1803, the method continues to step 1804, where the subscriber equipment is authorized to use the new key for transmissions (i.e., the status of the new key is changed in the subscriber equipment from pending to active). From step 1804, the method continues in step 1805, where the old key is deauthorized, disapproving it for use with subsequent transmissions. From step 1805, the method continues to step 1806, where the old key is deleted.

Figure 19:
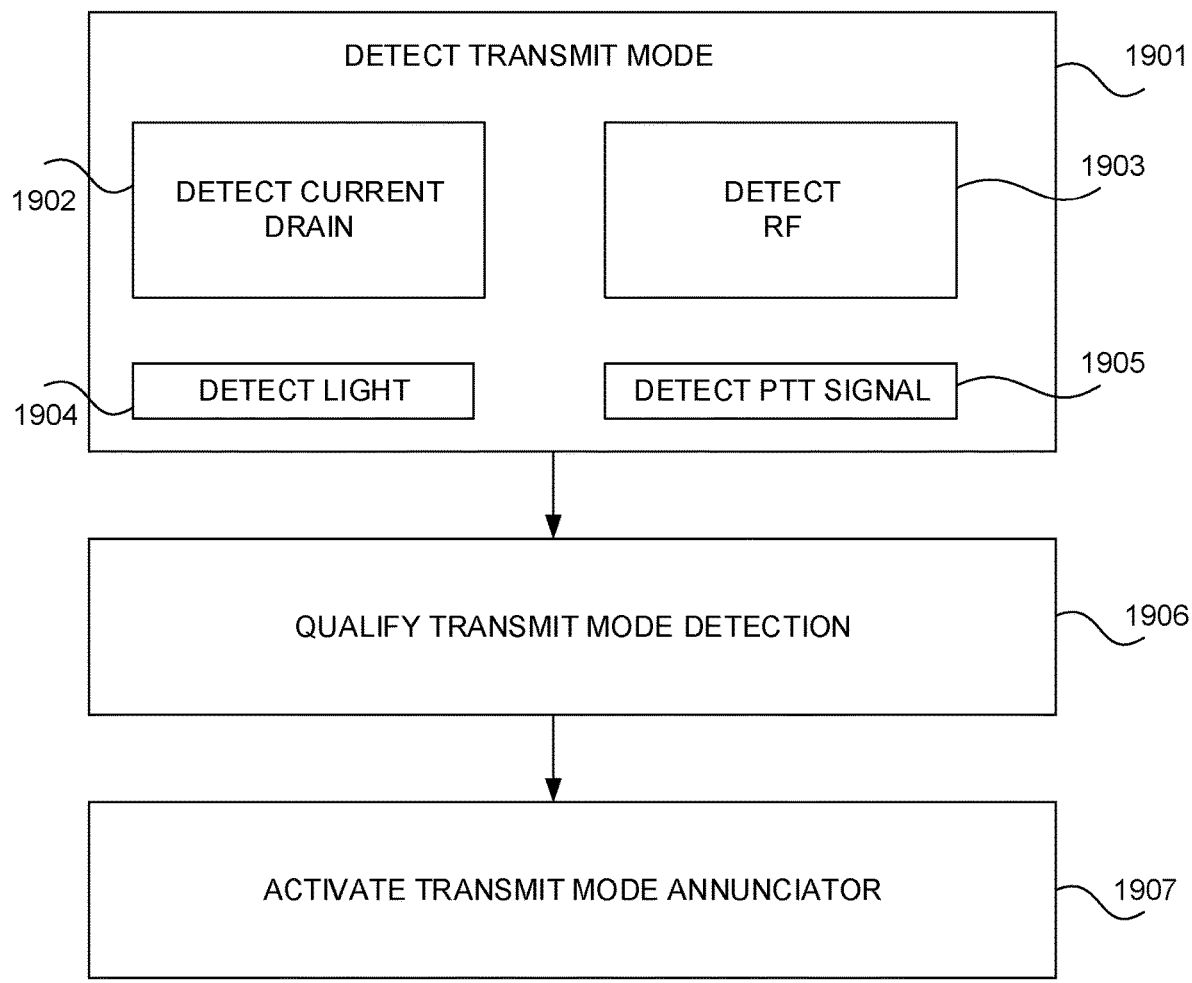
FIG. 19 is a flow diagram of a method of detecting unintended transmissions in accordance with at least one embodiment.

FIG. 19 is a flow diagram of a method of detecting unintended transmissions in accordance with at least one embodiment. The method begins in step 1901 by detecting a transmission mode. Step 1901 may comprise steps 1902, 1903, 1904, and/or 1905. In step 1902, a current drain is detected. In step 1903, a radio frequency (RF) emission is detected. In step 1904, illumination of an indicator light is detected. In step 1905, a push to talk (PTT) signal is detected. From step 1901, the method continues to step 1906, where transmission mode detection is qualified. For example, in accordance with at least one embodiment, detection of current drain in step 1902 combined with detection of RF energy in step 1903 but without detection of a PTT signal in step 1905 suggests the transmitter may be being keyed automatically (not under manual PTT control). As another example, in accordance with at least one embodiment, detection of current drain in step 1902 combined with detection of RF energy in step 1903 suggests the transmitter may be being keyed. As another example, in accordance with at least one embodiment, characteristics like the duration of a transmission or the state of other logic signals that may differ between automatically keyed signals and signals keyed under manual PTT control, may be used to qualify the transmission mode detection in step 1906. If the qualification of the transmission mode detection in step 1906 indicates an alert should be issued (e.g., if the transmitter appears to be keyed under automatic control), the method continues to step 1907, where activation of the transmit mode annunciator is performed.

Figure 20:
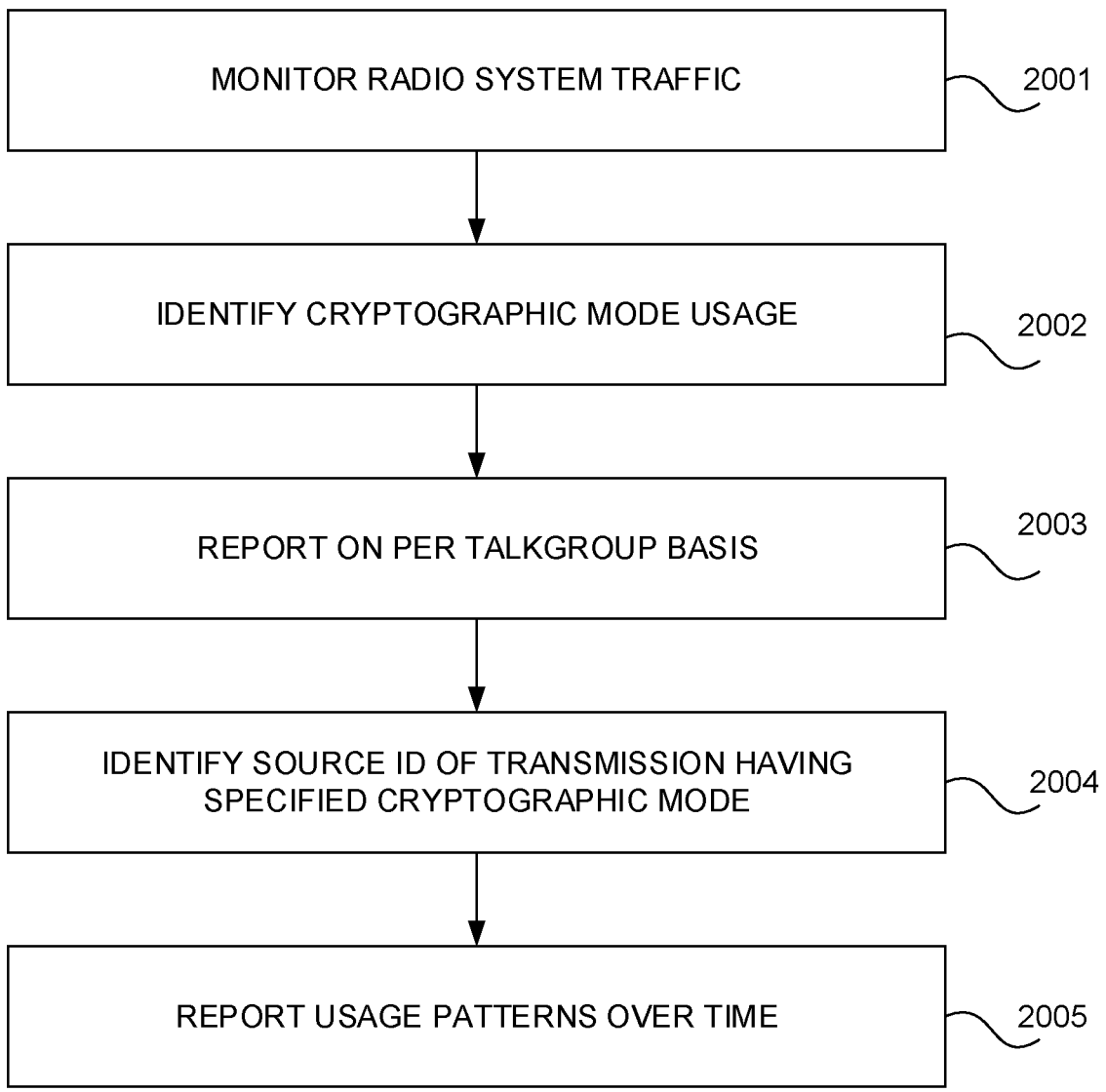
FIG. 20 is a flow diagram of a method of reporting cryptographic mode usage in accordance with at least one embodiment.

FIG. 20 is a flow diagram of a method of reporting cryptographic mode usage in accordance with at least one embodiment. The method begins in step 2001 by monitoring radio system traffic. From step 2001, the method continues in step 2002, where the cryptographic mode usage is identified. From step 2002, the method continues in step 2003, where the cryptographic mode usage is reported on a per talkgroup basis. From step 2003, the method continues in step 2004, where the source ID of a transmission having a specified cryptographic mode is identified. For example, in accordance with at least one embodiment, the specified cryptographic mode may be an encrypted mode (e.g., data encryption standard output feedback mode (DES-OFB), advanced encryption standard (AES), or others). As another example, in accordance with at least one embodiment, the specified cryptographic mode may be an unencrypted mode. From step 2004, the method continues in step 2005, where usage patterns are reported over time.

Figure 21:
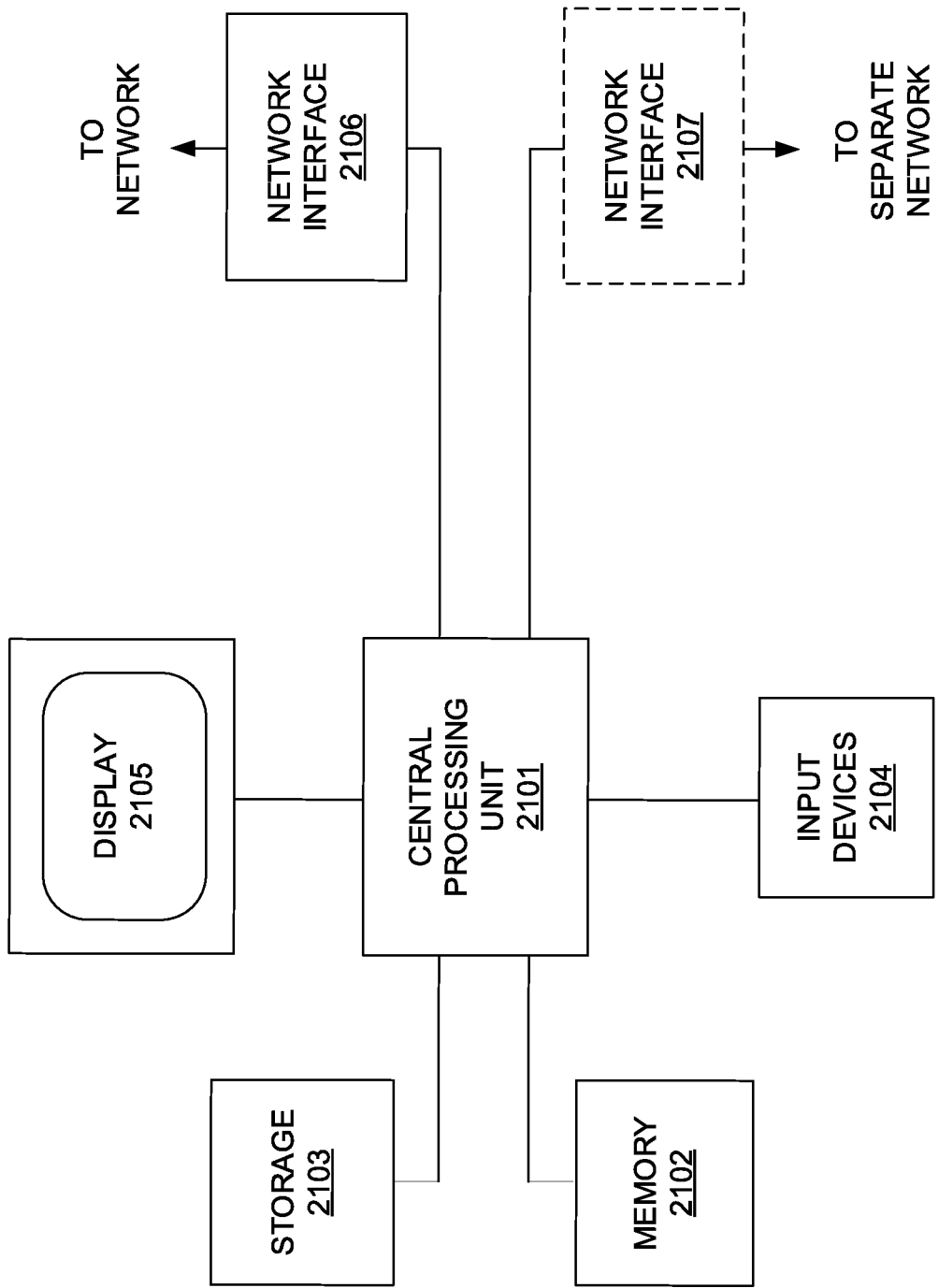
FIG. 21 is a block diagram of a processing system in accordance with at least one embodiment.

FIG. 21 is a block diagram illustrating an example of a processing system that may be used to implement one or more elements of a system in accordance with at least one embodiment of the present invention. For example, the processing system of FIG. 21 may be used to implement any one or more of elements of systems, apparatus, and/or methods depicted in other drawings. As one specific example, the processing system of FIG. 21 may be used to implement the computer 1305 of FIG. 13. The processing system of FIG. 21 comprises central processing unit 2101, memory 2102, storage 2103, input devices 2104, display 2105, network interface 2106, and, optionally, network interface 2107. Central processing unit 2101 of FIG. 21 may be a microprocessor, microcomputer, microcontroller, digital signal processor, state machine, logic circuitry, and/or any device that manipulates digital information based on operational instructions. The memory 2102 and/or storage 2103 may be a single memory device or a plurality of memory devices. Such a memory device may be a read only memory, random access memory, floppy disk memory, magnetic tape memory, hard drive memory, system memory, CD-ROM, DVD memory, and/or any device that stores digital information. Memory 2102 and storage 2103 may be memory structures that support read and write operations, such as random access memory, and/or memory structures that support read only operations, such as a read only memory, depending on the functionality to be provided. Note that when the central processing unit 2101 implements one or more of its functions via a state machine or logic circuitry, the memory containing the corresponding operational instructions may be embedded in the circuitry of the state machine and/or the logic circuitry.

Central processing unit 2101 is coupled to memory 2102, storage 2103, input devices 2104, display 2105, network interface 2106, and, optionally, network interface 2107. Input devices 2104 may be used to provide input information, such as an operator input, which may comprise data and/or operational instructions, to control central processing unit 2101. Display may be used to provide a graphical user interface to observe aspects of the operation of central processing unit 2101, including the execution of operational instructions within central processing unit 2101 to implement functionality of methods described herein.

Network interfaces 2106 and 2107 may be used to interface a node implemented in accordance with the processing system of FIG. 21 with other nodes of a network. For example, network interfaces 2106 and 2107 may be used to interface a node, such as computer 1305 of FIG. 13 with other nodes, such as other instances of computer 1305 of FIG. 13 to form a network of a plurality of nodes, such as nodes utilizing directional receivers 502 and 503 of FIG. 5 or first and second receivers 602 and 603 of FIG. 6. As another example, network interface 2107 may be used to maintain segregation of interfaces to increase privacy and/or security of information being transmitted over the networks coupled to network interfaces 2106 and/or 2107. As a more specific example, network interface 2106 may be used for communication with a wide area digital communications network, such as the internet, while network interface 2107 may be used for communication with a local area digital communications network, with restrictions placed on information communicated between the wide area digital communications network and the local area digital communications network in order to increase the privacy of information. Alternatively, other selective networking techniques, such as establishing a virtual private network (VPN) between a plurality of nodes of a network, such as nodes utilizing directional receivers 502 and 503 of FIG. 5 or first and second receivers 602 and 603 of FIG. 6 may be used to provide segregation of data flows through a single network interface, such as network interface 2106, without the need for an additional network interface, such as network interface 2107.

The memory 2102 and/or storage 2103 stores operational instructions that, when executed, allow the processing module to perform the functions required to provide functionality, such as functionality described as methods. The functions that are performed based on the operational instructions stored in memory 2102 and/or storage 2103 are discussed in greater detail herein.

Note that the processing system of FIG. 21 may implement some of the functions described herein through software stored in the memory 2102 and/or storage 2103, whereas other portions may be implemented using hardware or circuitry included within the processing system of FIG. 21. Thus, in some embodiments a mix of hardware and software may be used to perform functionality to implement a method described herein.

Figure 22:
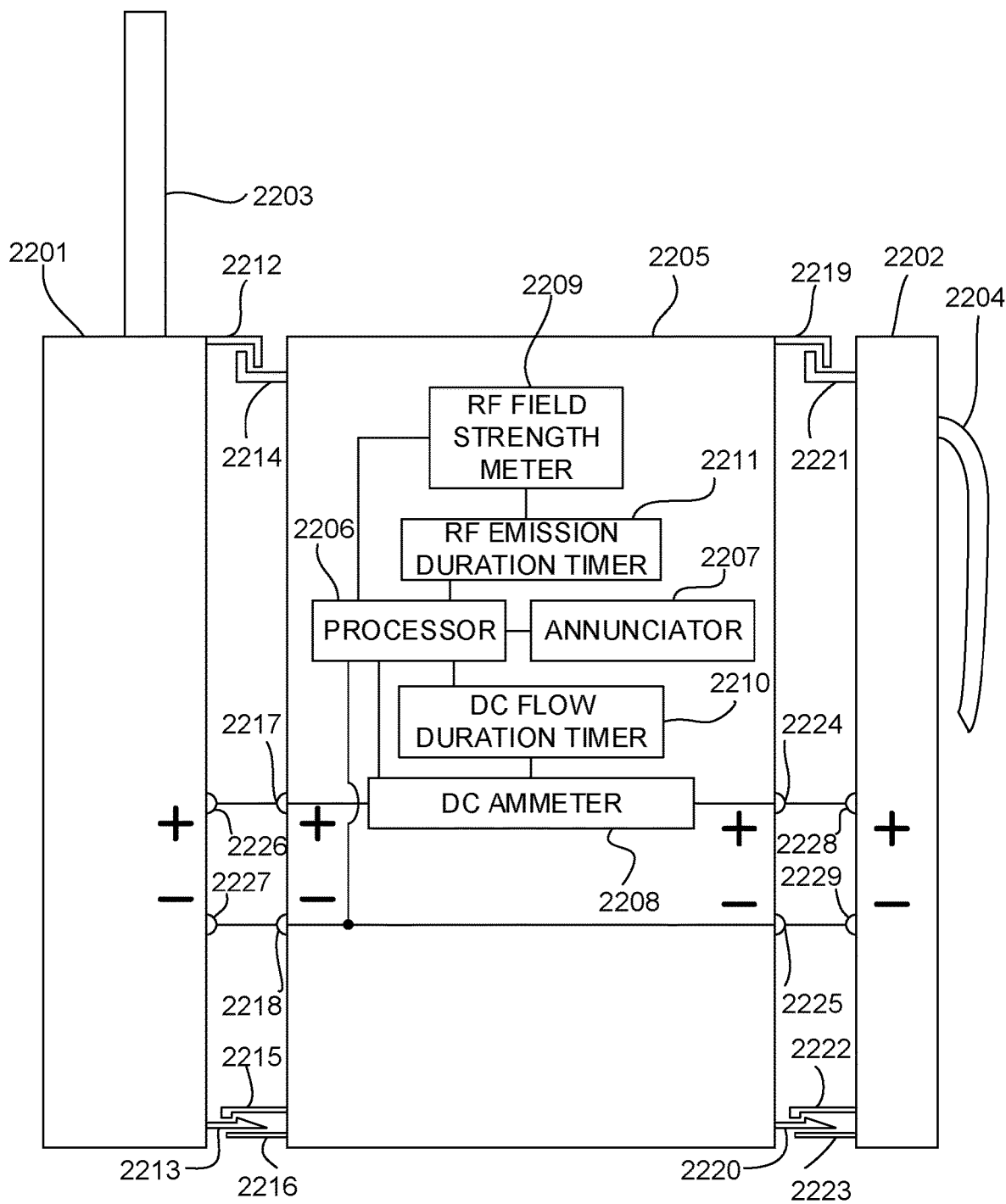
FIG. 22 is a block diagram of a transmission detection wedge in accordance with at least one embodiment.

FIG. 22 is a block diagram of a transmission detection wedge in accordance with at least one embodiment. Wireless equipment 2201 is mechanically coupled to transmission detection wedge 2205 via battery attachment mechanical couplings 2212 and 2213 of wireless equipment 2201 and radio attachment mechanical couplings 2214, 2215, and 2216 of transmission detection wedge 2205. Wireless equipment 2201 is electrically coupled to transmission detection wedge 2205 via battery attachment electrical couplings 2226 and 2227 of wireless equipment 2201 and radio attachment electrical couplings 2217 and 2218 of transmission detection wedge 2205. Battery 2202 is mechanically coupled to transmission detection wedge 2205 via radio attachment mechanical couplings 2221, 2222, and 2223 of battery 2202 and battery attachment mechanical couplings 2219 and 2220 of transmission detection wedge 2205. Battery 2202 is electrically coupled to transmission detection wedge 2205 via radio attachment electrical couplings 2228 and 2229 of battery 2202 and battery attachment electrical couplings 2224 and 2225 of transmission detection wedge 2205. Wireless device 2201 is coupled to antenna 2203. Battery 2202 is coupled to belt clip 2204.

In accordance with at least one embodiment, transmission detection wedge 2205 comprises processor 2206, direct current (DC) ammeter 2208, radio frequency (RF) field strength meter 2209, DC flow duration timer 2210, RF emission duration timer 2211, and annunciator 2207. In accordance with at least one embodiment, battery attachment electrical coupling 2225 of transmission detection wedge 2205 is coupled to radio attachment electrical coupling 2218 of transmission detection wedge 2205 and to processor 2206, annunciator 2207, RF field strength meter 2209, DC flow duration timer 2210, and RF emission duration timer 2211. In accordance with at least one embodiment, battery attachment electrical coupling 2224 of transmission detection wedge 2205 is coupled to DC ammeter 2208, processor 2206, annunciator 2207, RF field strength meter 2209, DC flow duration timer 2210, and RF emission duration timer 2211. In accordance with at least one embodiment, DC ammeter 2208 is coupled to radio attachment electrical coupling 2217 of transmission detection wedge 2205. In accordance with at least one embodiment, DC ammeter 2208 is coupled to processor 2206 and to DC flow duration timer 2210. In accordance with at least one embodiment, DC flow duration timer 2210 is coupled to processor 2206. In accordance with at least one embodiment, processor 2206 is coupled to annunciator 2207. In accordance with at least one embodiment, processor 2206 is coupled to RF field strength meter 2209 and RF emission duration timer 2211. In accordance with at least one embodiment, RF field strength meter 2209 is coupled to RF emission duration timer 2211.

Figure 23:
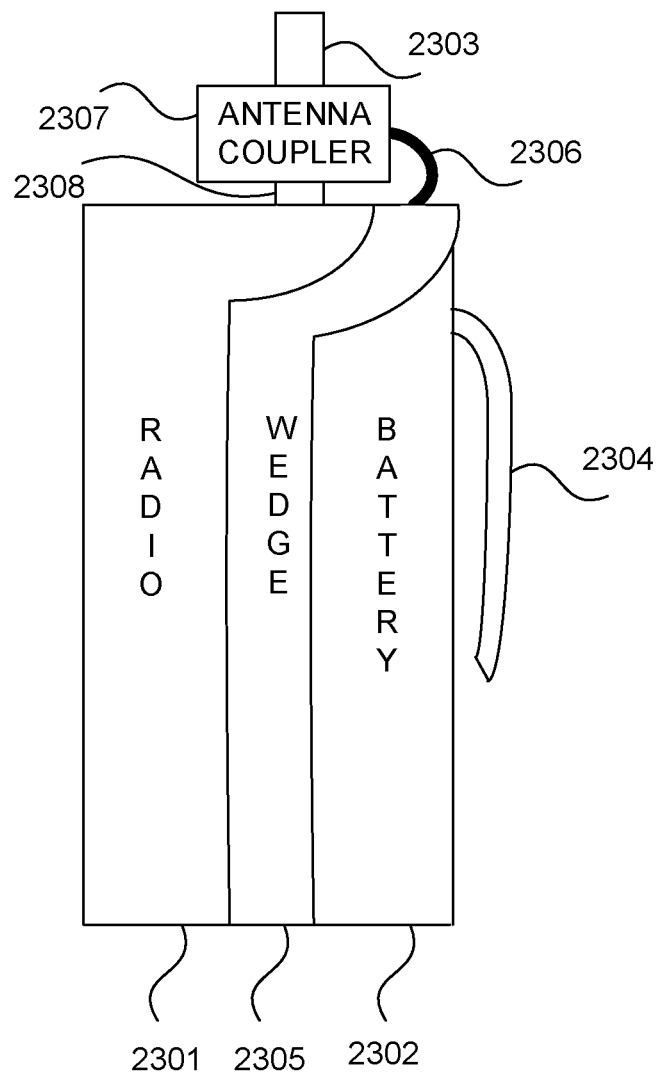
FIG. 23 is a diagram of transmission detection apparatus in accordance with at least one embodiment.

FIG. 23 is a diagram of transmission detection apparatus in accordance with at least one embodiment. The transmission detection apparatus comprises wedge 2305, coupling 2306, and antenna coupler 2307. Wedge 2305 is connected to radio 2301 and to battery 2302, for example, mechanically connected between radio 2301 and battery 2302. In accordance with at least one embodiment, battery 2302 is connected to a mechanical attachment 2304, which may, for example, be a belt clip or other mounting device. Wedge 2305 is connected to coupling 2306, which is connected to antenna coupler 2307. Radio 2301 is connected to antenna connection 2308, which is connected to antenna coupler 2307. Antenna coupler 2307 is connected to antenna 2303. Antenna coupler 2307 is illustrated as being outside of radio 2301, and, in accordance with at least one embodiment, antenna coupler 2307 is external to the housing of radio 2301. As an example, antenna coupler 2307 may connected to an external antenna connector of radio 2301, and antenna 2303 may be connected to antenna coupler 2307. However, in accordance with at least one embodiment, antenna coupler 2307 may be installed within radio 2301. In accordance with at least one embodiment, antenna coupler 2307 couples radio 2301, via antenna connection 2308, to antenna 2303 with low loss, for example, less than a decibel (dB), of power. In accordance with at least one embodiment, antenna coupler 2307 couples radio 2301, via antenna connection 2308, to wedge 2305, via coupling 2306, with relatively high loss, for example, 20 to 60 decibels (dB), of power. Thus, a transmit signal being transmitted by radio 2301 may be sampled by wedge 2305 via antenna coupler 2307 with minimal effect on the transmission and reception of radio 2301 via antenna 2303. Wedge 2305 comprises a circuit sensitive to the transmitted signal of radio 2301, allowing wedge 2305 to detect when radio 2301 is transmitting. Wedge 2305 can qualify the detected transmitted signal, for example, by measuring the duration of the detected transmitted signal and determining an attribute of the detected transmitted signal, for example, whether the detected transmitted signal is a voice transmission, a status transmission (e.g., for communicating a predetermined status), a message transmission (e.g., for communicating a predetermined short message), a paging transmission (e.g., for paging another radio), or a data transmission (e.g., a data communication in accordance with a common air interface (CAI) paradigm). In accordance with at least one embodiment, wedge 2305 provides, directly or indirectly (e.g., via an external accessory, for example, a Bluetooth, digital enhanced cordless telecommunications (DECT), or other external accessory), an audible, visual, or tactile indication in response to qualifying a detected transmitted signal. Thus, a radio user can be warned of unintended transmissions emanating from radio 2301. As an example, wedge 2305 can provide warning of unintended transmissions such as responses to malformed received digital communications, status transmissions, message transmissions, paging transmissions, data transmissions, the like, or a combination thereof. In accordance with at least one embodiment, the circuit in wedge 2305 sensitive to the transmitted signal of radio 2301 is a receiver capable of receiving and demodulating the detected transmitted signal. In accordance with such an embodiment, wedge 2305 may demodulate and decode the detected transmitted signal to positively identify the type of the detected transmitted signal and the specific information it represents. As an example, wedge 2305 may identify a source identifier and a destination identifier of the information represented by the detected transmitted signal and may qualify the detected transmitted signal based on the source identifier, the destination identifier, the type of transmission, other attributes of the transmission, the like, or a combination thereof. As an example, wedge 2305 may refrain from causing an audible, visual, or tactile indication when a detected transmitted signal is determined to be of a known permissible type, to be between known stations, to be encrypted, to be valid, to be in response to a valid received communication, the like, or a combination thereof.

Figure 24:
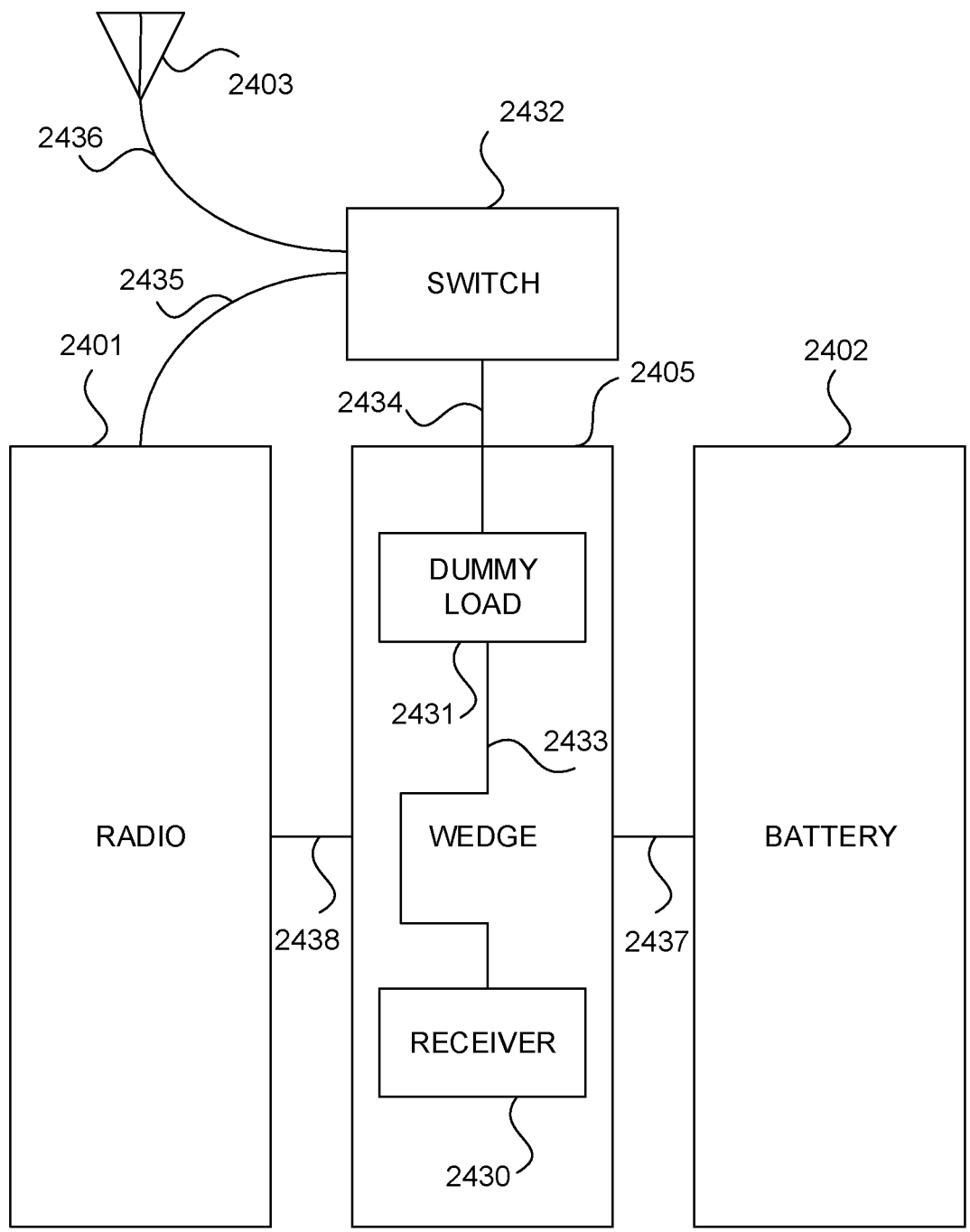
FIG. 24 is a block diagram of transmission detection apparatus in accordance with at least one embodiment.

FIG. 24 is a block diagram of transmission detection apparatus in accordance with at least one embodiment. The transmission detection apparatus comprises wedge 2405 and switch 2432. Wedge 2405 comprises a dummy load 2431 and a receiver 2430. Wedge 2405 is connected to battery 2402 via connection 2437. Wedge 2405 receives its power from battery 2402. Wedge 2405 is connected to radio 2401 via connection 2438. Radio 2401 receives its power from battery 2402 via wedge 2405. Radio 2401 is connected to switch 2432 via connection 2435. Switch 2432 is connected to antenna 2403 via connection 2436. Switch 2432 is connected to wedge 2405 via connection 2434. As an example, connection 2434 connects switch 2432 to dummy load 2431. Dummy load 2431 is connected to receiver 2430 via connection 2433. Switch 2432 may be a switch capable of switching radio frequency (RF) signals, such as a relay (for example, a type of relay typically called a transmit/receive (T/R) relay), diode switching (e.g., positive-insulation-negative (PIN) semiconductor diode switching), the like, or a combination thereof. Switch 2342, under control of a processor in wedge 2405, can divert a transmitted signal from radio 2401 to dummy load 2431 instead of to antenna 2403. By causing radio 2401 to deliver the power of its transmitted signal to dummy load 2431 instead of to antenna 2403, wedge 2405 can largely prevent radio 2401 from emanating a transmitted signal over the air. In accordance with at least one embodiment, switch 2432 may be configured to allow a small portion of the transmitted signal from radio 2401 to leak into dummy load 2431 even when switch 2432 is coupling radio 2401 to antenna 2403. Such leakage may be provided by, for example, a resistive coupling, a capacitive coupling, the like, or a combination thereof between connections 2435 and 2434. Thus, receiver 2430 may monitor the transmitted signal from radio 2401 even when switch 2432 is coupling the majority of the power of the transmitted signal from radio 2401 to antenna 2403.

Wedge 2405 may operate in, for example, a permissive mode or a restrictive mode. In a restrictive mode, wedge 2405 may normally allow radio transmissions by normally coupling radio 2401 to antenna 2403 but restrict undesired transmissions by diverting them to dummy load 2431. As an example, a processor in wedge 2405 may cause switch 2432 to couple radio 2401 to antenna 2403. With receiver 2430 monitoring a small amount of the transmitted signal, receiver 2430 and the processor of wedge 2405 may detect when radio 2401 is making an undesired transmission, and the processor may cause switch 2432 to divert the energy of the undesired transmission to dummy load 2431. As receiver 2430 is able, in accordance with at least one embodiment, to continue monitoring the transmitted signal regardless of the state of switch 2432, when receiver 2430 and the processor of wedge 2405 have determined that radio 2401 is no longer producing an undesired transmitted signal, the processor can cause switch 2432 to redirect the energy of the transmitted signal of radio 2401 to antenna 2403. In a permissive mode, wedge 2405 may normally prevent radio transmissions by normally diverting them to dummy load 2431 but enable desirable radio transmissions by switching switch 2432 to couple them to antenna 2403. As an example, a processor in wedge 2405 may cause switch 2432 to divert the transmitted signal of radio 2401 to dummy load 2431. With receiver 2430 monitoring a small amount of the transmitted signal, receiver 2430 and the processor of wedge 2405 may detect when radio 2401 is making a desired transmission, and the processor may cause switch 2432 to direct the energy of the desired transmission to antenna 2403. As receiver 2430 is able, in accordance with at least one embodiment, to continue monitoring the transmitted signal regardless of the state of switch 2432, when receiver 2430 and the processor of wedge 2405 have determined that radio 2401 is no longer producing a desired transmitted signal, the processor can cause switch 2432 to redirect the energy of the transmitted signal of radio 2401 to dummy load 2431. To be able to receive signals at radio 2401 when radio 2401 is not transmitting but switch 2432 is coupling connection 2435 to dummy load 2431, it may be useful to provide a separate path from antenna 2403 to a receiver portion of radio 2401. For example, a circulator or isolator may be used to provide such a separate path. As another example, a separate receive antenna may be connected to the receiver portion of radio 2401 to provide such a separate path. In accordance with at least one embodiment, a variation that combines aspects of the restrictive mode and the permissive mode may be practiced. As an example, wedge 2405 may operate in a permissive mode when radio 2401 is not transmitting and may switch to a restrictive mode when radio 2401 is transmitting. Such a variation or the restrictive mode described above can be used, for example, with transmissions that begin with a necessary, but generally benign, initial portion, for example, a preamble to allow synchronization of a receiver to the transmitted signal.

Figure 25:
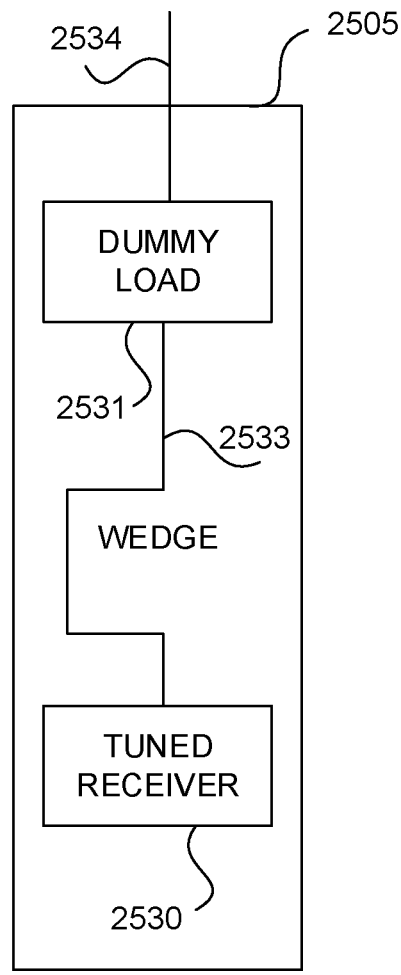
FIG. 25 is a block diagram of a transmission detection wedge utilizing a tuned receiver in accordance with at least one embodiment.

FIG. 25 is a block diagram of a transmission detection wedge utilizing a tuned receiver in accordance with at least one embodiment. The wedge 2505 comprises dummy load 2531 and tuned receiver 2530. Such a wedge 2505 may be used, for example, in transmission detection apparatus such as that illustrated in FIG. 24. A connection 2534 to dummy load 2531 may be connected to a switch, such as switch 2432 of FIG. 24. Dummy load 2531 is connected to tuned receiver 2530 via connection 2533. Tuned receiver 2530 is capable of being tuned to a frequency on which a radio, such as radio 2401 of FIG. 24, is transmitting or receiving. Tuned receiver 2530, which is connected to a processor of wedge 2505, can detect signals being transmitted or received by the radio. The processor can qualify the signals to determine if the signals are desirable or undesirable. The processor can switch the state of the switch in accordance with such determinations. As an example, if tuned receiver 2530 and the processor detect malformed units being received by or transmitted by the radio, the processor can cause the switch to connect the antenna or the radio to the dummy load to prevent the reception of malformed units or the transmission of malformed units or responses to malformed units.

Figure 26:
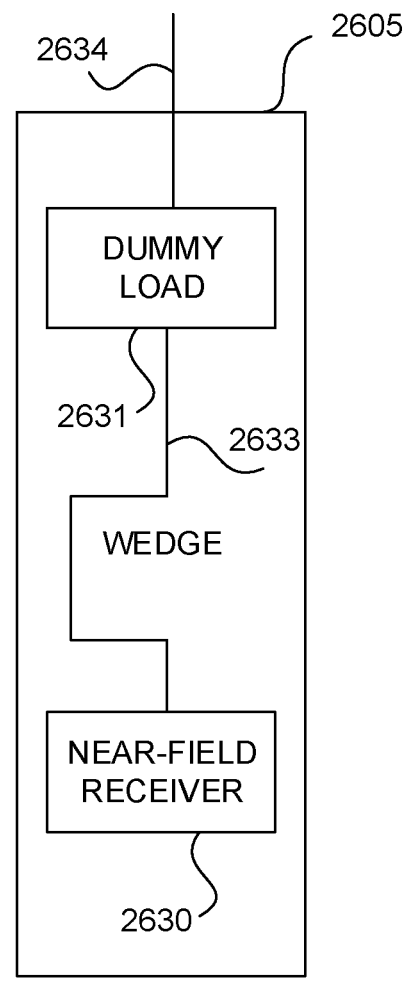
FIG. 26 is a block diagram of a transmission detection wedge utilizing a near-field receiver in accordance with at least one embodiment.

FIG. 26 is a block diagram of a transmission detection wedge utilizing a near-field receiver in accordance with at least one embodiment. The wedge 2605 comprises dummy load 2631 and near-field receiver 2630. Such a wedge 2605 may be used, for example, in transmission detection apparatus such as that illustrated in FIG. 24. A connection 2634 to dummy load 2631 may be connected to a switch, such as switch 2432 of FIG. 24. Dummy load 2631 is connected to near-field receiver 2630 via connection 2633. Near-field receiver 2630 is responsive to radio frequency (RF) energy such as that a radio, such as radio 2401 of FIG. 24, is transmitting. Near-field receiver 2630, which is connected to a processor of wedge 2605, can detect signals being transmitted or received by the radio. The processor can qualify the signals to determine if the signals are desirable or undesirable. The processor can switch the state of the switch in accordance with such determinations. As an example, if near-field receiver 2630 and the processor detect malformed units being received by or transmitted by the radio, the processor can cause the switch to connect the antenna or the radio to the dummy load to prevent the reception of malformed units or the transmission of malformed units or responses to malformed units.

In accordance with at least one embodiment, a method comprises receiving a network identifier comprising a data unit identifier; checking validity of the data unit identifier; combinatorially processing a data unit according to a plurality of possible data unit identifier values; selecting a most likely data unit identifier value based according to results of the combinatorially processing the data unit; and performing subsequent processing of the data unit in accordance with the most likely data unit identifier value. In accordance with at least one embodiment, the step of combinatorially processing the data unit further comprises quantitatively adjusting a likelihood of the data unit identifier having a first possible data identifier value. In accordance with at least one embodiment, the step of quantitatively adjusting the likelihood further comprises applying a stochastic adjustment to the likelihood. In accordance with at least one embodiment, the step of combinatorially processing the data unit further comprises processing the data unit as if it were a header data unit (HDU); processing the data unit as if it were a terminator data unit (TDU) without link control information; processing the data unit as if it were a first type of logical link data unit (LDU1); processing the data unit as if it were a second type of logical link data unit (LDU2); and processing the data unit as if it were a terminator data unit (TDU) with link control information. In accordance with at least one embodiment, the step of combinatorially processing the data unit further comprises processing the data unit as if it were a packet data unit (PDU).

In accordance with at least one embodiment, a method comprises transmitting less robustly coded data at a higher power level; and transmitting more robustly coded data at a lower power level, wherein the less robustly coded data and the more robustly coded data are transmitted within a single continuous transmission. In accordance with at least one embodiment, a transition between a lower power level and a higher power level is performed at a rate that places any amplitude modulation sidelobes away from data symbol carrier frequency deviations.

In accordance with at least one embodiment, a method comprises truncating a data transmission before normal completion of the data transmission; listening for interference; and restarting transmission of the data transmission from a beginning of the data transmission. In accordance with at least one embodiment, the method further comprises localizing a source of the interference. In accordance with at least one embodiment, the steps of truncating, listening, and restarting are repeated with the truncating occurring progressively later in the transmission.

In accordance with at least one embodiment, a method for rekeying subscriber equipment comprises rekeying the subscriber equipment with a first new key; utilizing an old key until receiving authorization to use the first new key; and utilizing the first new key after receiving the authorization to use the first new key.

In accordance with at least one embodiment, a method for rekeying subscriber equipment comprises rekeying the subscriber equipment with a first new key; attempting to utilize the first new key for bidirectional communication with a second subscriber equipment unit; receiving a message from the second subscriber equipment unit encrypted with an old key that predates the first new key; and utilizing the old key for bidirectional communication with the second subscriber unit.

In accordance with at least one embodiment, apparatus for detecting unintentional transmissions from wireless apparatus comprises a direct current (DC) ammeter for detecting DC flow from a battery to the wireless apparatus; a radio frequency (RF) field strength meter for detecting RF emission from the wireless apparatus; and an annunciator for issuing an unintentional transmission alert. In accordance with at least one embodiment, the apparatus further comprises a DC flow duration timer for measuring a DC flow duration of the DC flow; and a processor for qualifying the DC flow based on its DC flow duration. In accordance with at least one embodiment, the apparatus further comprises a RF emission duration timer for measuring a RF emission duration of the RF emission; and a processor for qualifying the RF emission based on its RF emission duration. In accordance with at least one embodiment, the apparatus further comprises a DC flow duration timer for measuring a DC flow duration of the DC flow, wherein the processor is further for qualifying the RF emission and the DC flow based on the RF emission duration and the DC flow duration. In accordance with at least one embodiment, the DC ammeter, the RF field strength meter, and the annunciator are housed in an enclosure interposed between a battery and the wireless apparatus, wherein the enclosure comprises a radio attachment mechanical coupling to mechanically couple the enclosure to the wireless apparatus; a radio attachment electrical coupling to electrically couple the enclosure to the wireless apparatus; a battery attachment mechanical coupling to mechanically couple the enclosure to the battery; and a battery attachment electrical coupling to electrically couple the enclosure to the battery.

In accordance with at least one embodiment, a method comprises monitoring radio system traffic; identifying cryptographic mode usage; reporting cryptographic mode usage on a per talkgroup basis; identifying a source identifier of a transmission having a specified cryptographic mode; and reporting cryptographic mode usage patterns over time. In accordance with at least one embodiment, the method further comprises providing an alert for cryptographic mode usage wherein unencrypted traffic is detected on a frequency on which encrypted traffic is expected. In accordance with at least one embodiment, the method further comprises providing an alert for cryptographic mode usage wherein unencrypted traffic is detected on a talkgroup on which encrypted traffic is expected.

In accordance with at least one embodiment of the present invention, an article of manufacture is provided comprising a nontransitory computer usable medium having computer readable program code embodied therein for causing a method as described herein to be performed. In accordance with at least one embodiment of the present invention, means for performing functions, such as those achieved in accordance with description provided herein, may be used.

What is claimed is:

1. A method comprising:
   truncating, in a radio, a data transmission before normal completion of the data transmission;
   listening, in the radio, for interference;
   restarting, in the radio, transmission of the data transmission from a beginning of the data transmission; and
   iteratively continuing to truncate, listen, and restart progressively, with truncation occurring at different data portions of the data transmission.

2. The method of claim 1 wherein, for a first iteration, truncation occurs upon transmission of a portion of a frame synchronization (FS) data portion, wherein, for a second iteration, truncation occurs upon transmission of the FS data portion and a portion of a network identifier (ND) data portion, and wherein, for a third iteration, truncation occurs upon transmission of the FS data portion, the ND data portion, and a portion of a payload data unit.

\* \* \* \* \*